(12) United States Patent
Park et al.

(10) Patent No.: US 11,112,448 B2
(45) Date of Patent: Sep. 7, 2021

(54) LOW INSERTION FORCE CONNECTOR ASSEMBLY AND SEMICONDUCTOR COMPONENT TEST APPARATUS

(71) Applicant: KEMITEC INC, Seongnam-si (KR)

(72) Inventors: jooneon Park, Seongnam-si (KR); sangil An, Yongin-si (KR)

(73) Assignee: KEMITEC INC, Seongnam-si (KR)

( * ) Notice: Subject to any disclaimer, the term of this patent is extended or adjusted under 35 U.S.C. 154(b) by 0 days.

(21) Appl. No.: 16/604,572

(22) PCT Filed: Apr. 11, 2018

(86) PCT No.: PCT/KR2018/004243
§ 371 (c)(1),
(2) Date: Oct. 11, 2019

(87) PCT Pub. No.: WO2018/190633
PCT Pub. Date: Oct. 18, 2018

(65) Prior Publication Data
US 2020/0096553 A1    Mar. 26, 2020

(30) Foreign Application Priority Data

Apr. 12, 2017 (KR) .................. 10-2017-0047608
Jul. 7, 2017 (KR) .................. 10-2017-0086293
Mar. 14, 2018 (KR) .................. 10-2018-0029858

(51) Int. Cl.
*G01R 31/28* (2006.01)
*H01R 12/83* (2011.01)
(Continued)

(52) U.S. Cl.
CPC ............. *G01R 31/28* (2013.01); *H01R 12/83* (2013.01); *H01R 13/639* (2013.01); *H01R 13/64* (2013.01)

(58) Field of Classification Search
CPC ............ H01R 12/7076; H01R 12/7082; H01R 12/83; H01R 13/405; H01R 13/639; H01R 13/64; G01R 31/28
(Continued)

(56) References Cited

U.S. PATENT DOCUMENTS 2,654,872 A * 10/1953 Saul .................. H01R 4/52
439/261
6,679,714 B2 * 1/2004 Kimura .................. H01R 12/88
439/261
(Continued)

FOREIGN PATENT DOCUMENTS

JP    2006-214732 A    8/2006
JP    4860242 B2    1/2012
(Continued)

OTHER PUBLICATIONS

International Search Report for PCT/KR2018/004243 dated Sep. 7, 2018 from Korean Intellectual Property Office.

*Primary Examiner* — Peter G Leigh
(74) *Attorney, Agent, or Firm* — Revolution IP, PLLC

(57) ABSTRACT

A low insertion force connector assembly includes a first connector and a second connector which are detachably coupled to each other, wherein the first connector and the second connector are easily assembled to prevent contact failure and are firmly assembled to each other to improve dimensional stability, and it is easy to assemble and manufacture the connectors.

15 Claims, 27 Drawing Sheets

(51) Int. Cl.
*H01R 13/639* (2006.01)
*H01R 13/64* (2006.01)

(58) Field of Classification Search
USPC .................................................... 439/66, 259
See application file for complete search history.

(56) References Cited

U.S. PATENT DOCUMENTS

| | | | | |
|---|---|---|---|---|
| 8,063,652 | B2* | 11/2011 | Amemiya | G01R 1/07371 |
| | | | | 324/754.11 |
| 9,548,560 | B2* | 1/2017 | Ikenaka | H01R 13/629 |
| 2002/0061664 | A1* | 5/2002 | Yoshida | H05K 7/1007 |
| | | | | 439/70 |
| 2002/0064987 | A1 | 5/2002 | Kimura | |
| 2007/0108996 | A1 | 5/2007 | Amemiya et al. | |
| 2014/0127922 | A1* | 5/2014 | Sasaki | H01R 13/187 |
| | | | | 439/259 |

FOREIGN PATENT DOCUMENTS

| | | | |
|---|---|---|---|
| KR | 10-2002-0042494 A | | 6/2002 |
| KR | 10-0490608 B1 | | 5/2005 |
| KR | 10-2009-0133102 A | | 12/2009 |
| KR | 20090133102 A | * | 12/2009 |

* cited by examiner

LOW INSERTION FORCE CONNECTOR ASSEMBLY AND SEMICONDUCTOR COMPONENT TEST APPARATUS

TECHNICAL FIELD

The present invention relates to a low insertion force connector assembly and a semiconductor component test apparatus, and more particularly, to a low insertion force connector assembly and a semiconductor component test apparatus that are capable of achieving rigid and simple coupling between a first connector and a second connector and stable contacts between connector pins and contact pins.

BACKGROUND ART

So as to allow a connector and a connection component mounted onto the connector to be electrically connected to each other reliably, connector pins of the connector and electrical terminals of the connection component have to be pressurized against each other. If the pressurizing forces are strong, electrical contacts become increased, but frictional forces are also big, so that it is hard to insert or separate the connection component into or from the connector. If a plurality of pins is mounted on the connector or if connection components are inserted simultaneously into a plurality of connectors, especially, a relatively large force has to be applied to insert the connection components into the plurality of connectors. So as to solve the above-mentioned problem, there is suggested a zero insertion force (ZIF) connector that does not need any force at the time when a connection component is inserted thereinto and pressurizes connector pins against the connection component after the insertion of the connection component.

A semiconductor test apparatus used to test fine semiconductors needs high reliability in operation. So as to reliably test the semiconductors at a high speed, the connector used in the test apparatus should be reliably coupled with the connection component.

FIG. 1 is a front view showing a first connector of a conventional connector assembly, FIG. 2 is a plan view showing the first connector of the conventional connector assembly, FIG. 3 is a bottom view showing the first connector of the conventional connector assembly, FIG. 4 is a sectional view taken along the line 5-5 of FIG. 1, FIG. 5 is a front view showing a second connector of the conventional connector assembly, FIG. 6 is a plan view showing the second connector of the conventional connector assembly, FIG. 7 is a front view showing the conventional connector assembly, FIG. 8 is a sectional view taken along the line 15-15 of FIG. 7, and FIG. 9 is a sectional view taken along the line 15-15 of FIG. 7, which shows the same connector assembly being in a complete fitting state as FIG. 8.

As shown in FIGS. 1 to 5, a first connector 1 of the conventional connector assembly has a rectangular parallelepiped-shaped housing 2 having concave portions 4, contact assemblies 6 disposed in the concave portions 4, driving shafts 8 for driving the contact assemblies 6, a lever 10 connected to the driving shafts 8, and cover members 12 for protecting and keeping the contact assemblies 6 in the concave portions 4. Two rectangular openings 16 are formed in parallel with each other with respect to a bottom wall 14 (See FIG. 4) of the housing 2 along a longitudinal direction of the housing 2. Flanges 40 (See FIG. 4) protrude inward from the inner edges of each opening 16. Support walls 17 are formed integrally with both end portions of the openings 16 in such a manner as to have a height of about ½ of a height of the housing 2. A separation wall 18 for connecting the two support walls 17 is formed integrally with the bottom wall 14 between the openings 16.

The contact assemblies 6 are configured to have different two kinds of contacts 28 and 30 protected and kept in insulating base members 26 made of a resin by means of insert molding. The contacts 28 and 30 have respective bodies 34 and dynes 32 extended downward from the bodies 34 in such a manner as to be attached to a substrate (not shown). The bodies 34 are expanded to the outside. The base members 26 are attached to the openings 16 of the housing 2 by means of press-fitting.

The front ends of the curved bodies 34 of the contacts 28 and 30 of the contact assemblies 6 are accommodatedly oriented inward and are then extended linearly to form contact portions 36. The front ends of the contact portions 36 are bent more inward to form bent locking end portions 38. As the base members 26 are disposed in the openings 16, the contact assemblies 6 are attached to the housing 2.

The driving shafts 8 are molded with a metal material like stainless steel, and two driving shafts 8 corresponding to two pairs of contact rows are provided, so that the two driving shafts 8 are disposed between the two rows of the contacts 28 and 30. A body 7 formed on each driving shaft 8 by means of insert molding has a sectional shape of a conical cam.

The cover members 12 have rectangular shapes and include two rows of keeping portions 60 extended in long directions thereof on edge surfaces 62 thereof in such a manner as to correspond to the rows of contacts 28 and 30. The keeping portions 60 protrude from the edge surfaces 62 in such a manner as to be formed unitarily with the cover members 12. As most shown in FIG. 6, slots 64 extended in up and down directions are formed on both sides of the keeping portions 60 at the positions corresponding to the contact portions 36 of the contacts 28 and 30 along the long directions of the keeping portions 60. The contact portions 36 of the contacts 28 and 30 come into contact with the slots 64, so that they can come into contact with the electrical terminals.

Spaces 68 are formed inside each keeping portion 60 by dividing an interior of the keeping portion 60 through an isolation wall 66. Concave locking portions 70 are formed on the upper portions of the spaces 68, that is, around a flat surface 61 of the keeping portion 60. Holes 72 are penetrated into transverse centers of the cover members 12 on both ends of the keeping portions 60. Thin and long rectangular openings 74 are formed on both transverse sides of the cover members 12 in such a manner as to be adjacent to the holes 72. Cams 44 are disposed in the openings 74. Openings 80 are formed over the transverse directions of the cover members 12 around both ends of the cover members 12 on the outsides of the openings 74, and key type members 48 are disposed in the openings 80. Both ends of the cover members 12 are connected by means of connection portions 82. A curved concave portion 86 for accommodating the end of the driving shaft 8 connected to the lever 10 is formed on an end wall 84 of one side connector 82.

So as to attach the cover members 12 to the housing 2, the cover members 12 are disposed in the concave portions 4 of the housing 2, and after bolts 13 are inserted into the holes 72, next, they are fixedly coupled to nuts 23 of the housing 2. After that, the driving shafts 8 are rotatably supported in the housing 2. Further, the lever 10 protrudes outward from an incised portion 5 of the housing 2, so that it is possible to operate the lever 10 at the outside of the housing 2.

As shown in FIGS. 5 and 6, the conventional second connector 300 has a thin and long rectangular housing 102 and contacts 104. The second connector 300 has end portions 108 formed on both ends of a fitting portion 106 to the first connector 1 in such a manner as to have complementary shapes with the connection portions 82. Protrusions 112 protrude outward from outside sections 110 of the end portions 108 in the long direction of the housing 102 in such a manner as to correspond to the two driving shafts 8. Dynes 114 of the contacts 104 protrude downward from the second connector 300. The fitting portion 106 has two fitting concave portions 116 formed therein in parallel with each other in such a manner as to correspond to the keeping portions 60 to accommodate the keeping portions 60 therein.

As shown in FIGS. 7 to 9, the long diameters of bodies 7 of the contacts 28 and 30 are in longitudinal directions in a state just before the second connector 300 and the first connector 1 are completely fitted to each other, so that the contacts 28 and 30 are in displaced states to the most inner side. Accordingly, the contact portions 36 of the contacts 28 and 30 are not moved to the outsides of the slots 64, but they are located within the slots 64. On the other hand, front end contact portions 126 of the second connector 300 come into slight contact with the contact portions 36 of the contacts 28 and 30, and accordingly, they are in a low contact pressure. The base members 27 have ribs 27a formed on the lower ends of both sides thereof in such a manner as to be extended to the long directions thereof, and the ribs 27a are attachedly connected to the lower ends of the end portions 19a of the openings 19 of the housing 2.

If the lever 10 is rotated by about 90°, it is cooperatively operated with the driving shafts 8 so that the cams 44 are rotated in the opposite directions to each other. Stopping portions 44a of the cams 44 coming contact with fitted surfaces 122 are separated from the fitted surfaces 122 and are moved in transverse directions within rear grooves 20. That is, the second connector 300 is in a complete fitting position. If the bodies 7 of the driving shafts 8 are rotated by about 90°, the long diameters thereof are moved in the transverse directions to pressurize the bodies 34 of the contacts 28 and 30 outward. Accordingly, the contact portions 36 of the contacts 28 and 30 are displaced to the outsides and moved toward the contacts 104 of the second connector 300 so that they come into contact with the contacts 104. As a result, the contacts 104 and the contacts 28 and 30 are electrically connected to each other.

However, the coupled state between the conventional connectors is dependent upon a frictional engagement force. Accordingly, the contacted states of the contacts may be poor or the coupled state between the connectors may be released according to external forces applied to the connectors.

As the number of contacts of the connectors is increased, further, an insertion force needed for coupling the connectors becomes large and the coupling process becomes also difficult.

A semiconductor component test apparatus used to test a semiconductor component requires very high reliability electrically or positionally. To rapidly and reliably test the semiconductor component, a connector used for the test apparatus should come into contact with a connection component reliably.

FIG. 30 is a sectional view showing a conventional semiconductor component test apparatus for texting electrical properties of semiconductor components. As shown in FIG. 30, the conventional semiconductor component test apparatus includes a contactor 20 coming into contact with a semiconductor component 10, a substrate 30 for supplying electrical signals to the contactor 20, a plurality of connection components 40 fixed to the substrate 30, a plurality of connectors 50 detachably connected to the plurality of connection components 40, a connector stand 90 for fixing the plurality of connectors 50, and a holder 80 for supporting the plurality of connectors 50 and the connector stand 90.

Generally, the substrate 30 and the connector stand 90 have a round shape, and the plurality of connection components 40, the plurality of connectors 50, and a plurality of fixing members 86 like bolts are disposed radially from the centers of the substrate 30 and the connector stand 90. Relative positions of the substrate 30 and the holder 80 are fixed, and even if a force in a vertical direction is applied between the connection components 40 and the connectors 50, accordingly, relative position relations between the connection components 40 and the connectors 50 are maintained.

FIG. 31 is a perspective view showing the connectors of the semiconductor component test apparatus of FIG. 30, and FIG. 32 is an enlarged view showing a portion of the connectors of FIG. 31. Each connector 50 has two handles 52 attached to the outside thereof to rotate a cam 52a disposed therein. Also, the connectors 50 have guides 2 located on the outside over the handles 52 to drive the handles 2 and a handle driver 4 for rotating the guides 2. As the handle driver 4 is driven in a state where the connection components 40 are inserted into the connectors 50, the guides 2 and the handles 52 are moved to allow the connectors 50 to be connected to the connection components 40. Accordingly, the connectors 50 are connected simultaneously to the connection components 40. The guides 2 are attached to the inner surfaces of the handles 52. So as to allow the guides 2 to be gently rotated with respect to the connectors 50, pulleys 6 are disposed between the connector stand 90 and the guides 2.

FIG. 33 is a sectional view taken along the line A-A of FIG. 32 so as to explain the connector 50.

As shown in FIG. 33, the connector 50 includes a connector body 51 made of a synthetic resin to have a shape of a hollow body open in an up and down direction, upper supports 55 disposed on top openings of the connector body 51, lower support members 57 disposed on bottom openings of the connector body 51, cams 52a rotatably disposed in the connector body 51 in such a manner as to be connected to the handles 52, and a plurality of connector pins 53 arranged in a longitudinal direction of the connector body 51 in such a manner as to be located on both sides of the cams 52a.

If the upper supports 55 are disposed on the top openings of the connector body 51, upward open concave grooves are formed on the top of the connector 50.

The upper supports 55 have downward open portions formed on the lower portions thereof and protrude upward to form side open portions communicating with the downward open portions on the left and right sides of the protruding portion thereof. The lower portions of the connector pins 53 are inserted into the upper supports 55, and the upper portions thereof are located on the side open portions of the upper supports 55. The connector pins 53 are extended downward to pass through the cams 52a and the lower support members 57, so that the end portions thereof protrude downward from the connector body 51 and are then connected to a test board (not shown).

The upper supports 55 have the lower open portions spaced apart from each other to the left and right sides and the protruding portions protruding from the tops of the lower open portions. The cams 52a are located on the lower portions of the lower open portions of the upper supports 55. The connector pins 53 are located on both sides of each cam 52a, and they are pressurized against the cam 52a.

FIG. 34 is a plan perspective view showing a connection component of the conventional semiconductor component test apparatus, and FIG. 35 is a bottom perspective view showing the connection component of FIG. 34.

Each connection component 40 includes a connection component body 41 made of a synthetic resin and a plurality of contact pins 43 spaced apart from each other along a longitudinal direction of the connection component body 41 in a plurality of rows. The connection component body 41 has concave portions formed on the underside thereof to insert the protruding portions of the upper supports 55, and the contact pins 43 are facingly disposed on both sides of the concave portions.

If a connection component insertion portion 41a of the connection component 40 is inserted into the groove portion formed on top of the connector 50, the protruding portions of the upper supports 55 of the connector 50 are inserted into the concave portions of the connection component 40, and the contact pins 43 of the connection component 40 are located to face the connector pins 53.

If the number of protruding portions of the upper supports 55 is two, the number of concave portions of the connection component 40 is two, and the contact pins 43 and the connector pins 53 are arranged in four rows, respectively.

The connection component 40 is inserted into the concave groove portion of the connector 50, and if the handles 52 are rotated to allow the cam 52a to pressurize the connector pins 53 arranged on both sides of the cam 52a outward, the connector pins 53 are pushed to the left and right sides and then protrude through the open portions to the left and right sides on the top of the upper support, so that they come into contact with the contact pins, thereby achieving contacts.

In the conventional semiconductor component test apparatus, the connection components 40 are fixed to the substrate 30 by means of rivets, which makes the fixing work inconvenient, and if there is a need to separate the connection components 40 from the substrate 30 after fixing, it is not easy to perform the separating work. Further, contact stability between the connector pins 53 and the contact pins 43 may be not ensured, and the connection components 40 may be damaged or broken due to the lack of rigidity thereof.

DISCLOSURE

Technical Problem

Accordingly, the present invention has been made in view of the above-mentioned problems occurring in the related art, and it is an object of the present invention to provide a low insertion force connector assembly and a semiconductor component test apparatus that are capable of achieving rigid and simple coupling between a first connector and a second connector to prevent occurrence of poor contacts, performing stable contacts between connector pins and contact pins, and avoiding breakage of connection components.

Technical Solution

To accomplish the above-mentioned object, according to one aspect of the present invention, there is provided a low insertion force connector assembly including a first connector and a second connector detachably coupled to each other, wherein the first connector includes an insertion groove having a shape of a rectangular section and formed concavely toward the second connector in such a manner as to insert a connector insertion portion of the second connector thereinto, first connector fastening holes penetrated onto both longitudinal sides of the insertion groove in an up and down direction in such a manner as to be coupled to a test head by means of bolts inserted thereinto, protruding portions formed in the insertion groove in such a manner as to be extended in a longitudinal direction and inserted into the second connector, a plurality of pin modules spaced apart from each other in a transverse direction and having a plurality of pins arranged in the longitudinal direction, and driving shafts rotatably disposed on the plurality of pins spaced apart from each other in the transverse direction to pressurize the plurality of pins in the transverse direction outward, the protruding portions having side surfaces spaced apart from the inner surfaces of the insertion groove, and the plurality of pins of the pin modules being arranged in the longitudinal direction in such a manner as to be exposed to both transverse sides of the protruding portions; and the second connector includes a connector insertion portion having a shape of a rectangular section in such a manner as to be inserted into the insertion groove, connector concave portions formed on the connector insertion portion in such a manner as to be open toward the first connector to insert the protruding portions, and a plurality of pins arranged in the longitudinal direction on both transverse sides of the connector concave portions, so that if the protruding portions are inserted into the connector concave portions, the plurality of pins of the first connector are arranged to face the plurality of pins of the second connector.

According to the present invention, desirably, the insertion groove includes body inner surfaces facing each other in the transverse direction and side inner surfaces facing each other in the longitudinal direction, so that a transverse distance between the body inner surfaces and a longitudinal distance between the side inner surfaces are increased toward the open end portion of the insertion groove, and the connector insertion portion includes first insertion surfaces as the outer surfaces extended in the transverse direction and second insertion surfaces as the outer surfaces extended in the longitudinal direction, so that a distance between the first insertion surfaces and a distance between the second insertion surfaces are reduced as the first insertion surfaces and the second insertion surfaces go toward the ends of the connector insertion portion.

According to the present invention, desirably, the bolts are inserted into the first connector fastening holes in such a manner as to be fastened to fastening portions of the test head to allow the first connector to be built on the test head, each bolt including a bolt head portion, a bolt guide portion having a protruding surface from the bolt head portion in such a manner as to be extended, and a bolt fastening portion having a bolt protruding portion from the bolt guide portion in such a manner as to be extended and screw-fastened to the fastening portion of the test head, and if the bolt fastening portion of the bolt is screw-fastened to the test head, the bolt protruding portion pressurizes the test head so that the first connector is slidable laterally between the bolt head portion and the test head, the bolt guide portion is located at the first connector fastening hole, and a tolerance is formed laterally between the bolt guide portion and the first connector fastening hole.

According to the present invention, desirably, the first connector includes two outer members facing each other in the transverse direction, an intermediate member located between the two outer members in the transverse direction, the four pin modules disposed between the intermediate member and the outer members on both transverse sides of the intermediate member, a top member inserted into the outer members on both transverse sides thereof in such a manner as to be disposed on top of the intermediate member, the two driving shafts rotatably disposed between the intermediate member and the outer members under the top member and having end portions protruding from one longitudinal side, and handles disposed on the protruding end portions of the driving shafts, each outer member including: a plate-shaped outer member body extended in the longitudinal direction; outer member side portions formed on both ends of the outer member body in the longitudinal direction in such a manner as to protrude inward in the transverse direction; outer member protrusion portions protruding inward from tops of the outer member side portions in the transverse direction, the outer members facing each other in the transverse direction being coupled to each other in such a manner as to allow the ends of the outer member protrusion portions to come into contact with each other; body inner surfaces inclinedly extended toward tops thereof in the longitudinal direction; top member insertion grooves concavely extended downward from the body inner surfaces in the longitudinal direction; outer member pin insertion grooves extended downward from the top member insertion grooves in the longitudinal direction in such a manner as to be concavely spaced apart from the top member insertion grooves; outer member protrusions protruding inward in the transverse direction from the outer member side portions; outer member coupling holes spaced apart from each other in the up and down direction around the outer member protrusions in such a manner as to be penetrated in the transverse direction, the outer member coupling holes being formed on the outer member protrusion portion and the outer member side portion, respectively; outer member axial grooves extended in the longitudinal direction on the outer member side portions between the outer member protrusion portions and the outer member protrusions in the up and down direction; and outer member lower protrusions extended more downward than the outer member body from the outer member side portions in such a manner as to form downward protruding surface and having PCB fastening holes penetrated thereinto in the transverse direction.

According to the present invention, desirably, the intermediate member includes: a plate-shaped intermediate member body extended in the longitudinal direction; and intermediate member side portions formed on both longitudinal ends of the intermediate member body in such a manner as to protrude in the transverse direction, the intermediate member side portions having intermediate member side protrusions protruding from tops thereof in the longitudinal direction, tops of the intermediate member side portions protruding more upward than top of the intermediate member body, the intermediate member body having first intermediate member surfaces formed slantly on both transverse sides thereof in such a manner as to become increased in thickness from the top to the bottom and intermediate member pin insertion grooves concavely formed spaced apart from the first intermediate member surfaces in the down direction at positions facing the outer member pin insertion grooves in such a manner as to be extended in the longitudinal direction; the intermediate member side portions having PCB seating portions formed by reducing thicknesses of the insides thereof in the longitudinal direction in such a manner as to form inward and downward protruding surfaces, the PCB seating portions having PCB fastening holes penetrated thereinto in the transverse direction, intermediate member axial grooves concavely formed on both transverse sides thereof and extended in the longitudinal direction therefrom in such a manner as to face the outer member axial grooves, outer member protrusion grooves concavely formed on both transverse sides thereof in such a manner as to insert the outer member protrusions, and intermediate member coupling holes spaced apart from the outer member protrusion grooves in the down direction in such a manner as to be penetrated thereinto in the transverse direction at the positions where the outer member coupling holes of the outer member side portions are formed, the first connector fastening holes being penetrated in the up and down direction into the intermediate member side protrusions.

According to the present invention, desirably, the outer member side portions have concave side support surfaces facingly formed concavely at the position where the outer member pin insertion groove is formed in the longitudinal direction, the concave side support surfaces whose end portions being connected to the outer member pin insertion groove.

According to the present invention, desirably, the intermediate member side portions have concave intermediate member support surfaces facingly formed concavely at the positions where the intermediate member pin insertion grooves are formed in the longitudinal direction in such a manner as to connect end portions thereof to the intermediate member pin insertion grooves.

According to the present invention, desirably, the top member includes: a top member body having top member concave portions concave downward from the underside thereof in such a manner as to be extended in the longitudinal direction; and top member protruding portions protruding upward from the top member body in such a manner as to be spaced apart from each other in the transverse direction and extended in the longitudinal direction, the top member body having top member body protrusions protruding from both transverse sides thereof in the transverse direction in such a manner as to be inserted into the top member insertion grooves and top member pin holes extended from the top member concave portions to the top member protruding portions in such a manner as to be exposed toward the transverse direction of the top member protruding portions, the top member pin holes being formed in four rows so that the two rows thereof are formed on one top member concave portion and one top member concave portion and the two rows thereof being formed on the other top member concave portion and the other top member concave portion.

According to the present invention, desirably, each pin module includes: a bar-shaped pin module body extended in the longitudinal direction; a plate-shaped pin module support extended upward from the pin module body in the longitudinal direction; a plurality of pins arranged in the longitudinal direction and penetrated into the pin module body and the pin module support in the up and down direction in such a manner as to allow top ends thereof to protrude upward from the pin module support and to allow bottom ends thereof to protrude downward from the pin module body; a pin module coupling groove and a pin module coupling protrusion formed on one side of the pin module body coming into contact with the pin module adjacent thereto in such a manner as to be spaced apart from each other in the longitudinal direction, the pin module coupling protrusion of the adjacent pin module being inserted into the pin module coupling groove, and the pin module coupling groove of the adjacent pin module inserting the pin module coupling protrusion thereinto; and a plurality of concave pin module body grooves spaced apart from each other in the longitudinal direction on the opposite transverse surface to the pin module body in such a manner as to be concavely penetrated in the up and down direction, and a plurality of intermediate member pin protrusions are spaced apart from each other in the longitudinal direction in the intermediate member pin insertion groove in such a manner as to protrude therefrom toward the outer members in the transverse direction, so that when the pin modules are coupled to the outer members, the pin module bodies of the pin modules are inserted into the outer member pin insertion grooves and the pin insertion protrusions are inserted into the pin module body grooves, and when the pin modules are coupled to the intermediate member, the pin module bodies of the pin modules are inserted into the intermediate member pin insertion grooves and the intermediate member pin protrusions are inserted into the pin module body grooves.

To accomplish the above-mentioned object, according to another aspect of the present invention, there is provided a low insertion force connector assembly including a first connector and a second connector detachably coupled to each other, wherein the first connector includes an insertion groove having a shape of a rectangular section and formed concavely toward the second connector in such a manner as to insert a connector insertion portion of the second connector thereinto, first connector fastening holes penetrated onto both longitudinal sides of the insertion groove in an up and down direction in such a manner as to be coupled to a test head by means of bolts inserted thereinto, protruding portions formed in the insertion groove in such a manner as to be extended in a longitudinal direction and inserted into the second connector, a plurality of pin modules spaced apart from each other in a transverse direction and having a plurality of pins arranged in the longitudinal direction in such a manner as to allow the plurality of pins of the pin module and the plurality of pins of the adjacent pin module to be spaced apart from each other in the transverse direction, and driving shafts rotatably disposed on the plurality of pins spaced apart from each other in the transverse direction to pressurize the plurality of pins in the transverse direction outward, the protruding portions having side surfaces spaced apart from the inner surfaces of the insertion groove, and the plurality of pins of the pin modules being arranged in the longitudinal direction in such a manner as to be exposed to both transverse sides of the protruding portions; and the second connector includes a connector insertion portion having a shape of a rectangular section in such a manner as to be inserted into the insertion groove, connector concave portions formed on the connector insertion portion in such a manner as to be open toward the first connector to insert the protruding portions, and a plurality of pins arranged in the longitudinal direction on both transverse sides of the connector concave portions, so that if the protruding portions are inserted into the connector concave portions, the plurality of pins of the first connector are arranged to face the plurality of pins of the second connector, the first connector including two outer members facing each other in the transverse direction, an intermediate member located between the two outer members in the transverse direction, the four pin modules disposed between the intermediate member and the outer members on both transverse sides of the intermediate member, a top member inserted into the outer members on both transverse sides thereof in such a manner as to be disposed on top of the intermediate member, the two driving shafts rotatably disposed between the intermediate member and the outer members under the top member and having end portions protruding from one longitudinal side, and handles disposed on the protruding end portions of the driving shafts.

According to the present invention, desirably, each pin module includes: a bar-shaped pin module body extended in the longitudinal direction; a plate-shaped pin module support extended upward from the pin module body in the longitudinal direction; the plurality of pins arranged in the longitudinal direction and penetrated into the pin module body and the pin module support in the up and down direction in such a manner as to allow top ends thereof to protrude upward from the pin module support and to allow bottom ends thereof to protrude downward from the pin module body; and a pin module coupling groove and a pin module coupling protrusion formed on one side of the pin module body coming into contact with the pin module adjacent thereto in such a manner as to be spaced apart from each other in the longitudinal direction, so that as the pin module coupling protrusion of the pin module body of one side pin module is inserted into the pin module coupling groove of the other side pin module and the pin module coupling groove of the pin module body of one side adjacent pin module inserts the pin module coupling protrusion of the other side pin module, the two pin modules are laminated in the transverse direction between the intermediate member and the outer member thereinto.

According to the present invention, desirably, each outer member includes: a plate-shaped outer member body extended in the longitudinal direction; outer member side portions formed on both ends of the outer member body in the longitudinal direction in such a manner as to protrude inward in the transverse direction; outer member protrusion portions protruding inward from tops of the outer member side portions in the transverse direction, the outer members facing each other in the transverse direction being coupled to each other in such a manner as to allow the ends of the outer member protrusion portions to come into contact with each other; body inner surfaces inclinedly extended toward tops thereof in the longitudinal direction; top member insertion grooves concavely extended downward from the body inner surfaces in the longitudinal direction; outer member pin insertion grooves extended downward from the top member insertion grooves in the longitudinal direction in such a manner as to be concavely spaced apart from the top member insertion grooves; outer member axial grooves extended in the longitudinal direction on the outer member side portions between the outer member protrusion portions and the outer member protrusions in the up and down direction; and outer member lower protrusions extended more downward than the outer member body from the outer member side portions in such a manner as to form downward protruding surface and having PCB fastening holes penetrated thereinto in the transverse direction.

According to the present invention, desirably, the intermediate member includes: a plate-shaped intermediate member body extended in the longitudinal direction; and intermediate member side portions formed on both longitudinal ends of the intermediate member body in such a manner as to protrude in the transverse direction, the intermediate member side portions having intermediate member side protrusions protruding from tops thereof in the longitudinal direction, tops of the intermediate member side portions protruding more upward than top of the intermediate member body, the intermediate member body having first intermediate member surfaces formed slantly on both transverse sides thereof in such a manner as to become increased in thickness from the top to the bottom and intermediate member pin insertion grooves concavely formed spaced apart from the first intermediate member surfaces in the down direction at positions facing the outer member pin insertion grooves in such a manner as to be extended in the longitudinal direction, and the intermediate member side portions having PCB seating portions formed by reducing thicknesses of the insides thereof in the longitudinal direction in such a manner as to form inward and downward protruding surfaces, the PCB seating portions having PCB fastening holes penetrated thereinto in the transverse direction, and intermediate member axial grooves concavely formed on both transverse sides thereof and extended in the longitudinal direction therefrom in such a manner as to face the outer member axial grooves, the first connector fastening holes being penetrated in the up and down direction into the intermediate member side protrusions.

According to the present invention, desirably, each pin module has a plurality of concave pin module body grooves spaced apart from each other in the longitudinal direction on the opposite transverse surface to the surface where the pin module coupling groove and the pin module coupling protrusion of the pin module body are formed in such a manner as to be extended in the up and down direction; a plurality of pin insertion protrusions protrude inward from the outer member pin insertion grooves in the transverse direction in such a manner as to be spaced apart from each other in the longitudinal direction; and a plurality of intermediate member pin protrusions are spaced apart from each other in the longitudinal direction in the intermediate member pin insertion groove in such a manner as to protrude therefrom toward the outer members in the transverse direction, so that when the pin modules are coupled to the outer members, the pin module bodies of the pin modules are inserted into the outer member pin insertion grooves and the pin insertion protrusions are inserted into the pin module body grooves, and when the pin modules are coupled to the intermediate member, the pin module bodies of the pin modules are inserted into the intermediate member pin insertion grooves and the intermediate member pin protrusions are inserted into the pin module body grooves.

According to the present invention, desirably, the outer member side portions have concave side support surfaces facingly formed concavely at the position where the outer member pin insertion groove is formed in the longitudinal direction, the concave side support surfaces whose end portions being connected to the outer member pin insertion groove; and the intermediate member side portions have concave intermediate member support surfaces facingly formed concavely at the positions where the intermediate member pin insertion grooves are formed in the longitudinal direction in such a manner as to connect end portions thereof to the intermediate member pin insertion grooves, so that both longitudinal ends of the pin module body of one side pin module of the two pin modules disposed between the intermediate member and the outer member come into contact with the concave side support surfaces, and both longitudinal ends of the pin module body of the other side pin module come into contact with the concave intermediate member support surfaces.

According to the present invention, desirably, the second connector includes a connector body having a shape of a rectangular section in such a manner as to be extended in the longitudinal direction and the connector insertion portion extended downward from a connector projection surface protruding downward from the underside of the connector body, the connector body having two connector concave portions spaced apart from each other in the transverse direction and connector body pin holes formed thereon in such a manner as to be extended upward and open on the top thereof and to allow bottoms thereof to communicate with the connector concave portions, the connector body pin holes being formed on both transverse sides of each connector concave portion in such a manner as to be spaced apart from each other in the longitudinal direction and communicate with the connector concave portions, and the plurality of pins are inserted into the connector body pin holes in such a manner as to allow top ends thereof to protrude upward from the top of the connector body and to allow bottom ends thereof to be exposed to the connector concave portions through the connector body pin holes, the plurality of pins being arranged on each connector concave portion in two rows.

According to the present invention, desirably, each connector body pin hole has an expanded pin hole portion expanded in the transverse direction from the top thereof, while placing the respective connector concave portions therebetween, and each pin includes a first bar-shaped pin portion extended in the up and down direction, a second pin portion bent from top of the first pin portion in such a manner as to allow an end portion thereof to be slantly extended toward the expanded direction of the expanded pin hole portion, a third pin portion bent from top of the second pin portion in such a manner as to allow an end portion thereof to be slantly extended toward the opposite direction to the second pin portion, and a fourth pin portion bent from top of the third pin portion in such a manner as to allow an end portion thereof to be slant toward the connector body, a bent portion between the third pin portion and the fourth pin portion being located more inward than the inner surfaces of the connector concave portions in the transverse direction.

According to the present invention, desirably, each pin includes a first bar-shaped pin portion extended in the up and down direction, a third pin portion bent and extended slantly from top of the first pin portion, and a fourth pin portion bent from top of the third pin portion in such a manner as to allow an end portion thereof to be slant toward the connector body, a bent portion between the third pin portion and the fourth pin portion being located more inward than the inner surfaces of the connector concave portions in the transverse direction.

To accomplish the above-mentioned object, according to yet another aspect of the present invention, there is provided a semiconductor component test apparatus including: a plate-shaped substrate having a plurality of substrate fixing pin holes formed thereon; a plurality of connection components coupled to the substrate by means of fixing pins and coupling members and having a plurality of contact pins arranged in a plurality of rows; and a plurality of connectors detachably coupled to the plurality of connection components and having a plurality of contact pins arranged in a plurality of rows, wherein each connection component includes connection component bodies and the plurality of contact pins arranged spaced apart from each other on the connection component bodies in the plurality of rows, each connection component body having a plurality of body fixing pin holes formed on the longitudinal direction, and the coupling members and the plurality of connection components are located on both sides of the substrate, while placing the substrate therebetween, so that the connection components are coupled to the substrate by locking heads of the fixing pins onto the plurality of body fixing pin holes, allowing the fixing pins to be passed sequentially through the plurality of body fixing pin holes and the substrate fixing pin holes, and locking the end portions thereof onto pin locking portions of the coupling members.

According to the present invention, desirably, the coupling member has a shape of a plate-like bar, the pin locking portions being spaced apart from each other along the longitudinal direction of the connection components, each pin locking portion having two pin locking members incised to a shape of "⊏" so that the two pin locking members have one side end connected to the coupling member and free end portions facing each other, and each fixing pin is inserted between the pin locking members in such a manner as to allow both side peripheries thereof to come into contact with the pin locking members.

According to the present invention, desirably, if the fixing pins are inserted into the pin locking portions, the pin locking members are pushed downward by means of the fixing pins in such a manner as to be slantly deformed downward to increase slant angles and a distance between the free ends, thereby locating the fixing pins between the free ends.

According to the present invention, desirably, the pin locking members are slantly bent downward from the coupling member to allow the facing free ends thereof to be spaced apart from each other, and if the fixing pins are inserted between the free ends of the pin locking portions, the pin locking members are deformedly pushed downward so that slant angles of the pin locking members are increased and a distance between the free ends is long, thereby locating the fixing pins between the free ends.

According to the present invention, desirably, the connection component further includes a connection component support, and the two connection component bodies have body bottoms spaced apart from each other in the longitudinal direction and having the plurality of body fixing pin holes formed thereon, first body extension portions facingly extended upward from both transverse sides of each body bottom and having body pin holes penetrated in the up and down direction in such a manner as to be spaced apart from each other in the longitudinal direction, body locking projections formed on both longitudinal sides of each body bottom in such a manner as to protrude over the first body extension portions, second body extension portions extended upward from the first body extension portions and having second body projection portions formed at the insides facing the first body extension portions, first body projection portions protruding upward from the outsides of the first body extension portions, and first body groove portions open downward on both transverse sides of each body bottom, the top ends of the body pin holes being open to the second body projection portions and the bottom ends thereof communicating with the first body groove portions, the contact pins being penetrated into the body pin holes so that the bottom portions thereof are extended to the first body groove portions in such a manner as to be exposed under the connection component bodies and the top portions thereof are extended to the insides of the second body extension portions, the connection component support including support bottoms spaced apart from each other on both sides of a support wall and having a plurality of support fixing pin holes spaced apart from each other in the longitudinal direction, a supporting portion extended upward and downward from the edges of the support bottoms, and the support wall extended upward from the transverse center of the support bottoms in such a manner as to allow both longitudinal ends thereof to be connected to the supporting portion so that the support wall and the supporting portion have upwardly open concave support portions located on both transverse sides of the support wall, the support bottoms including extension portion insertion holes penetrated in the up and down direction thereinto in such a manner as to be extended in the longitudinal direction and first support projection portions protruding downward from the extension portion insertion holes, the connection component bodies being moved upward toward both sides of the support wall to allow the first body extension portions and the second body extension portions to be inserted into the extension portion insertion holes so that the outer surfaces of the first body extension portions and the second body extension portions supportedly come into contact with the inner surfaces of the supporting portion and the support wall, the first body projection portions lockedly come into contact with the first support projection portions, and portions of the support bottoms between the extension portion insertion holes are inserted between the concave portions formed between the first body extension portions.

According to the present invention, desirably, the supporting portion has concave locking groove portions formed on the lower ends of both longitudinal sides thereof, and the body locking projections are inserted into the locking groove portions.

According to the present invention, desirably, the second body extension portions have concave contact pin grooves spaced apart from each other on the facing surfaces thereof along the longitudinal direction in such a manner as to be extended to tops of the second body extension portions and to allow bottom ends thereof to communicate with the body pin holes, and tops of the contact pins are inserted into the contact pin grooves.

According to the present invention, desirably, each contact pin has a concave pin portion concavely formed at the inner surface thereof in such a manner as to be extended along the longitudinal direction, so that when the connector pin comes into contact with the corresponding contact pin, the connector pin comes into contact with the concave pin portion.

Advantageous Effects

According to the present invention, the low insertion force connector assembly and the semiconductor component test apparatus can achieve easy and rigid coupling between the first connector and the second connector to prevent occurrence of poor contacts, simple and rigid coupling between the connection components and the substrate, stable contacts between the connector pins and the contact pins, and protection of the connection components from external impacts to prevent the connection components from being damaged or broken.

MODE FOR INVENTION

Hereinafter, a low insertion force connector assembly according to the present invention will be in detail explained with reference to the attached drawing.

Figure 1:
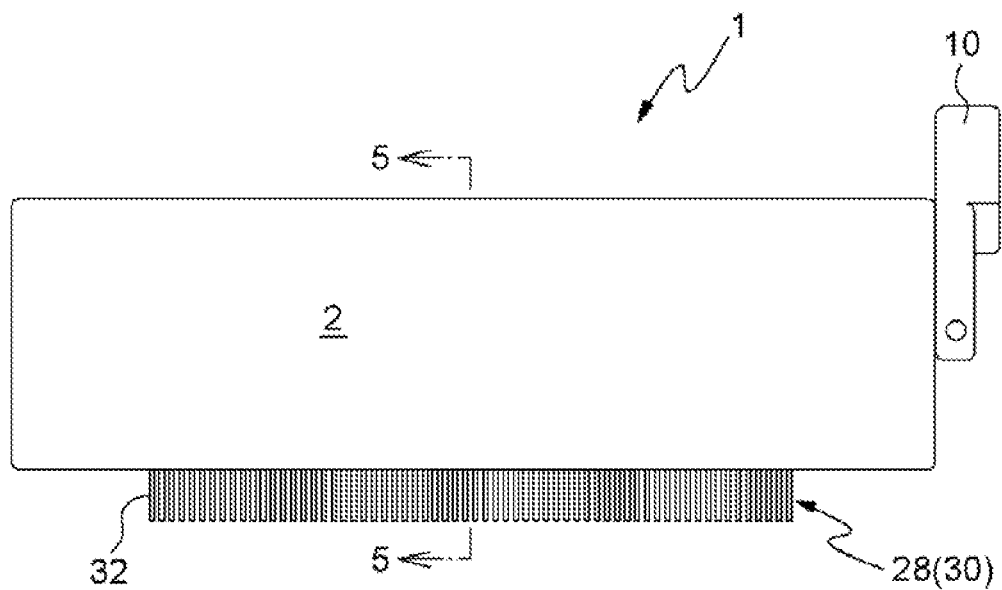
FIG. 1 is a front view showing a first connector of a conventional connector assembly.
Figure 2:
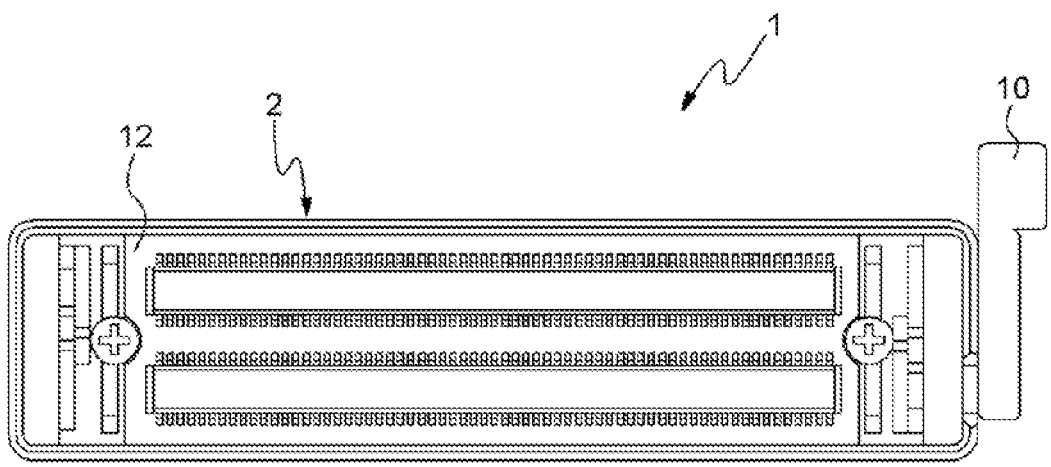
FIG. 2 is a plan view showing the first connector of the conventional connector assembly.
Figure 3:
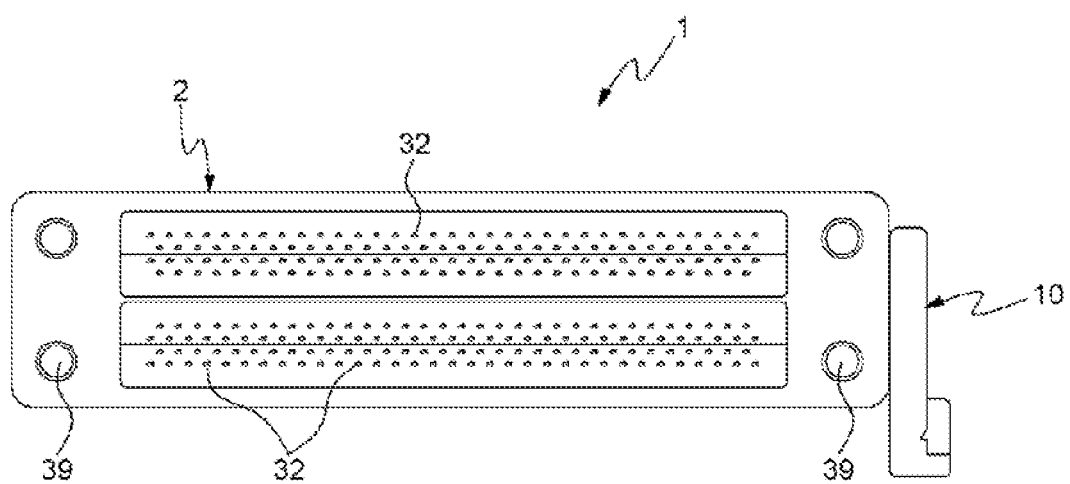
FIG. 3 is a bottom view showing the first connector of the conventional connector assembly.
Figure 4:
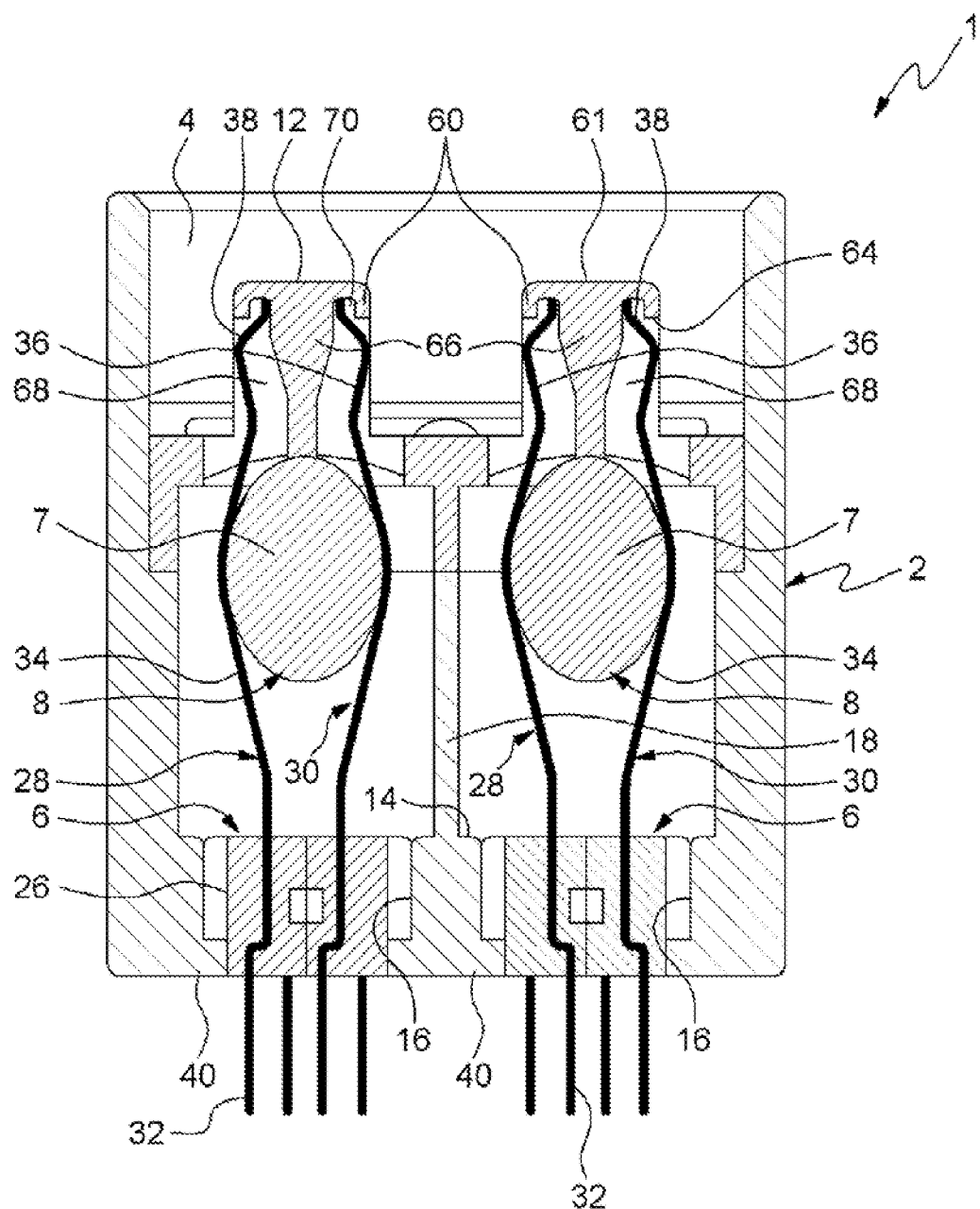
FIG. 4 is a sectional view taken along the line 5-5 of FIG. 1.
Figure 5:
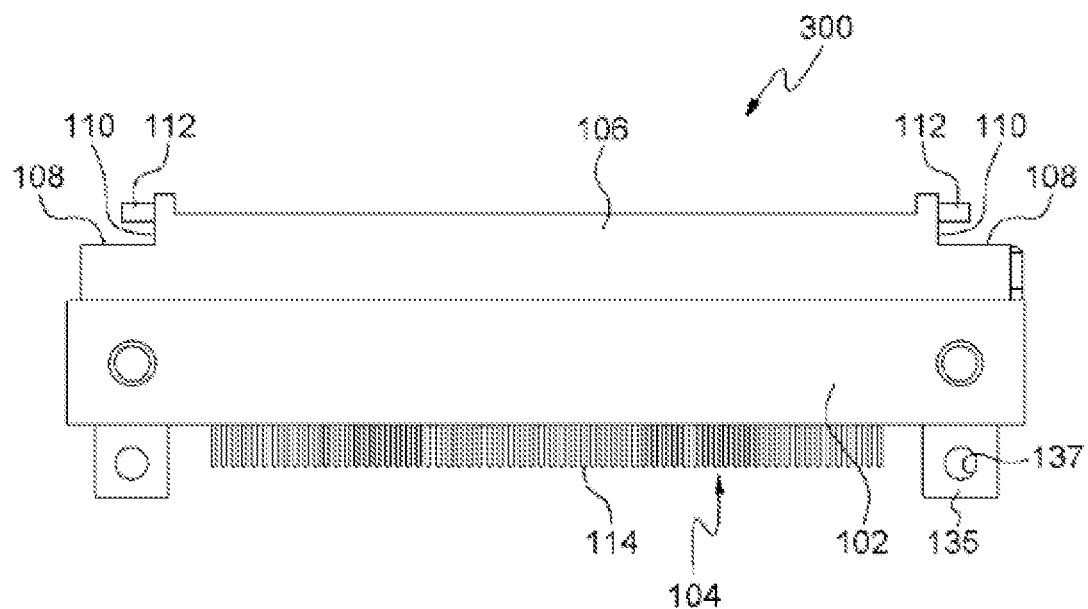
FIG. 5 is a front view showing a second connector of the conventional connector assembly.
Figure 6:
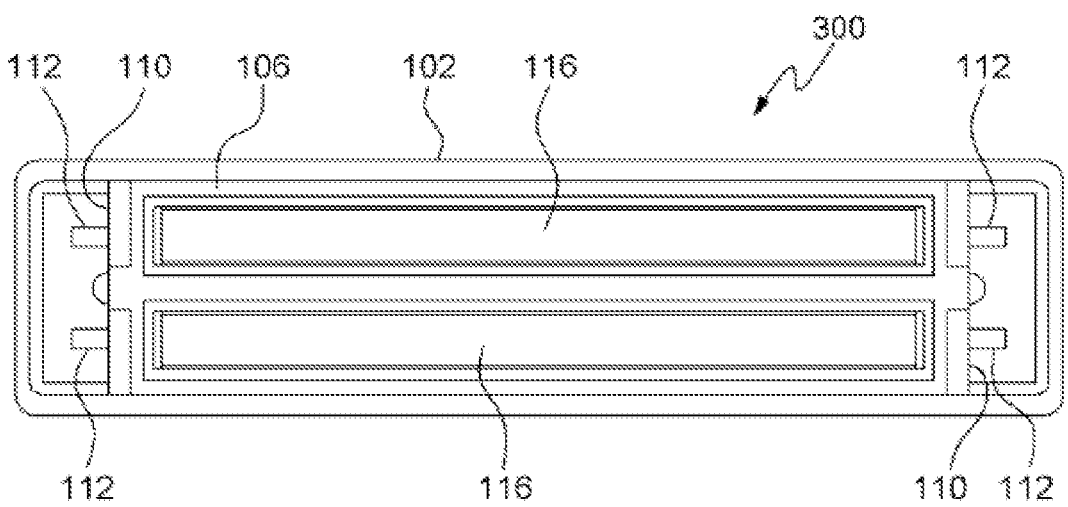
FIG. 6 is a plan view showing the second connector of the conventional connector assembly.
Figure 7:
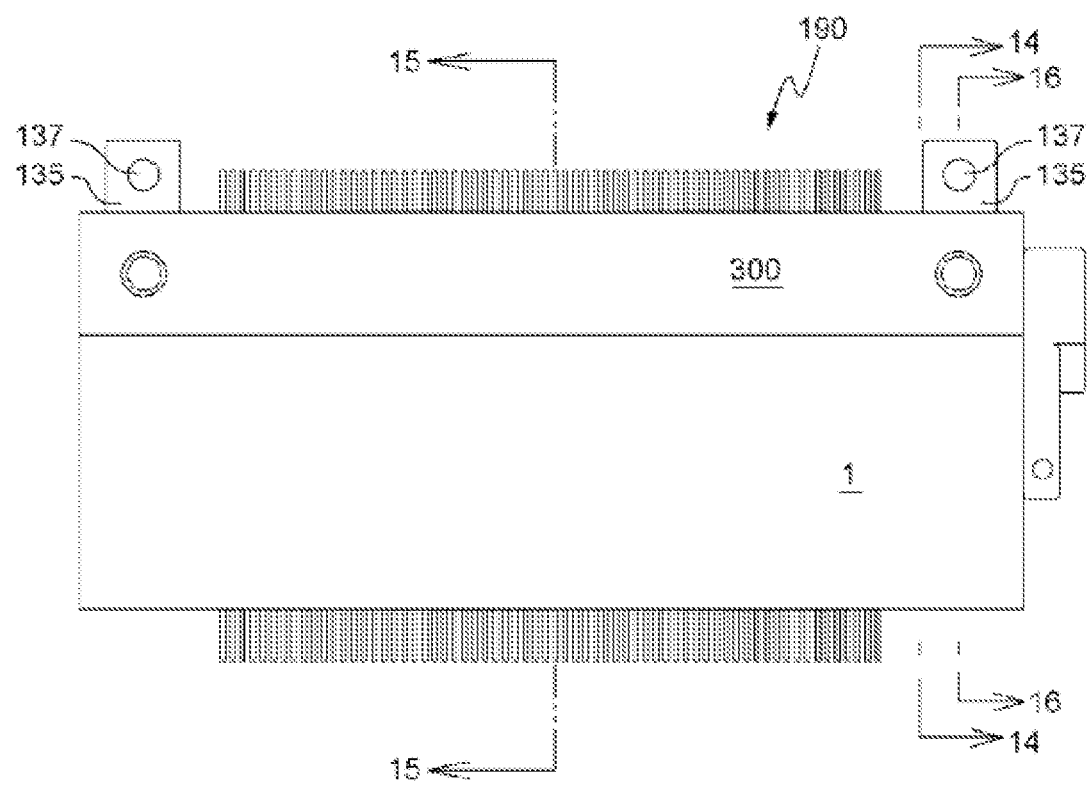
FIG. 7 is a front view showing the conventional connector assembly.
Figure 8:
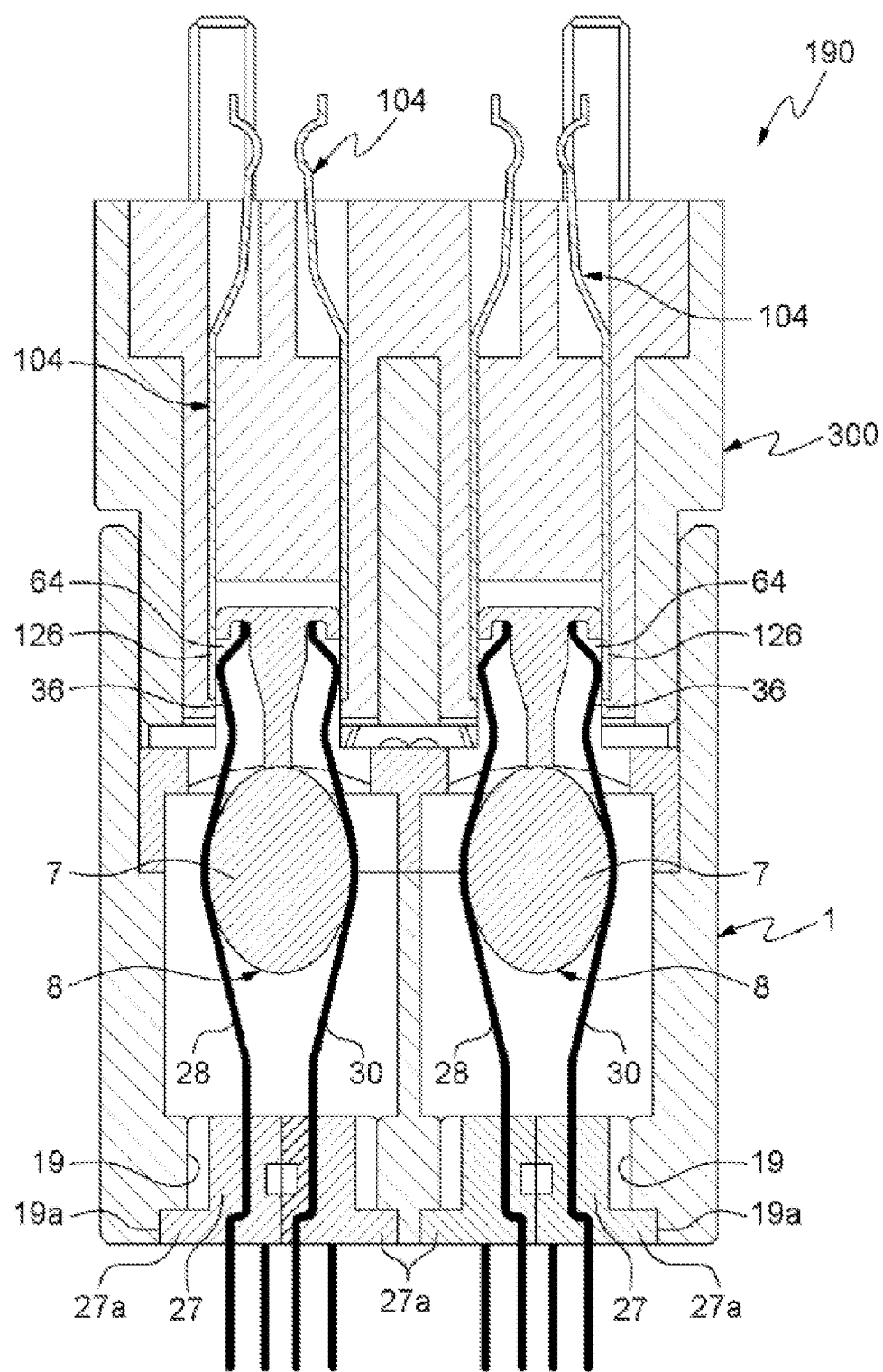
FIG. 8 is a sectional view taken along the line 15-15 of FIG. 7.
Figure 9:
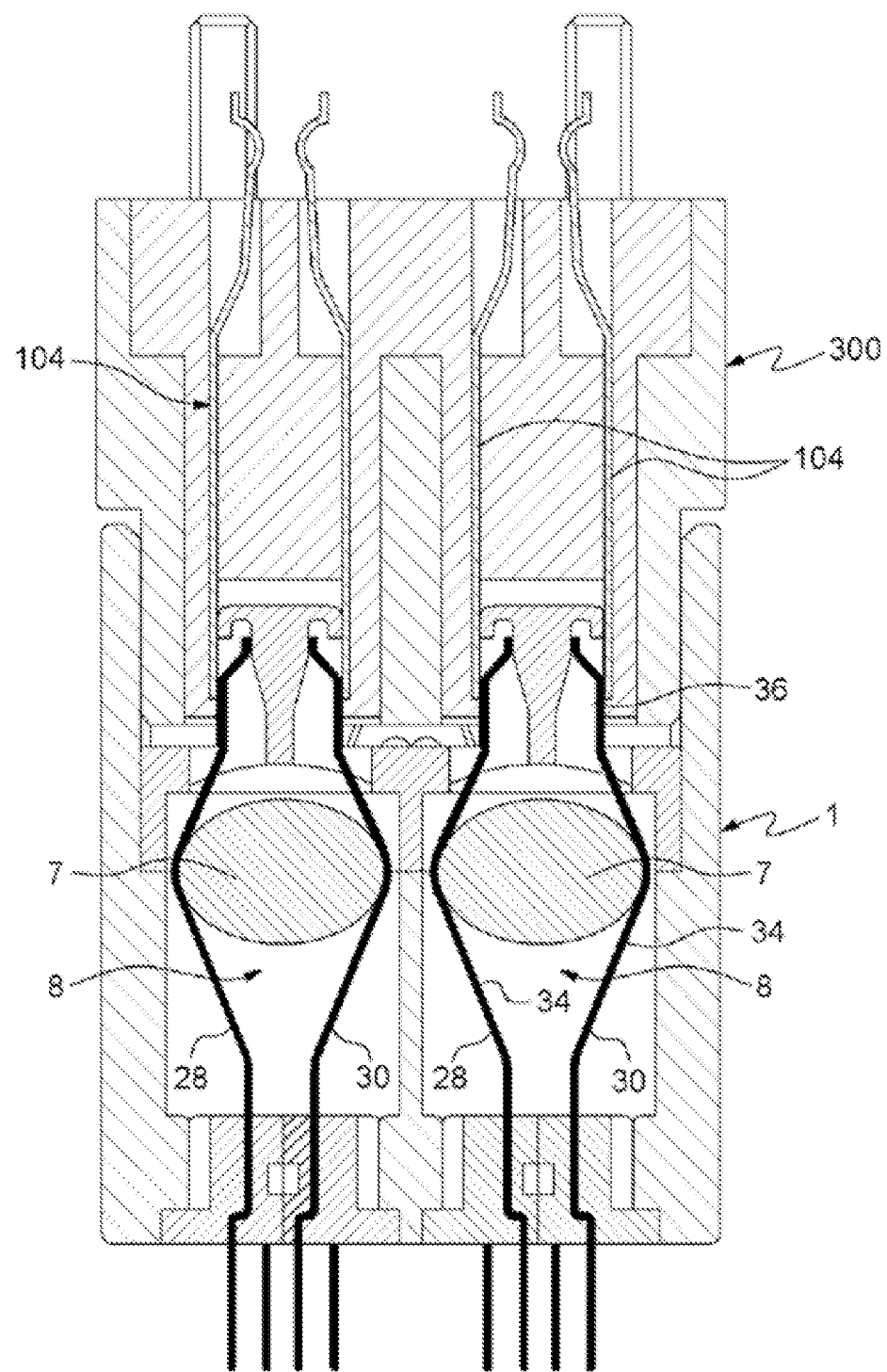
FIG. 9 is a sectional view taken along the line 15-15 of FIG. 7, which shows the same connector assembly being in a complete fitting state as FIG. 8.
Figure 10:
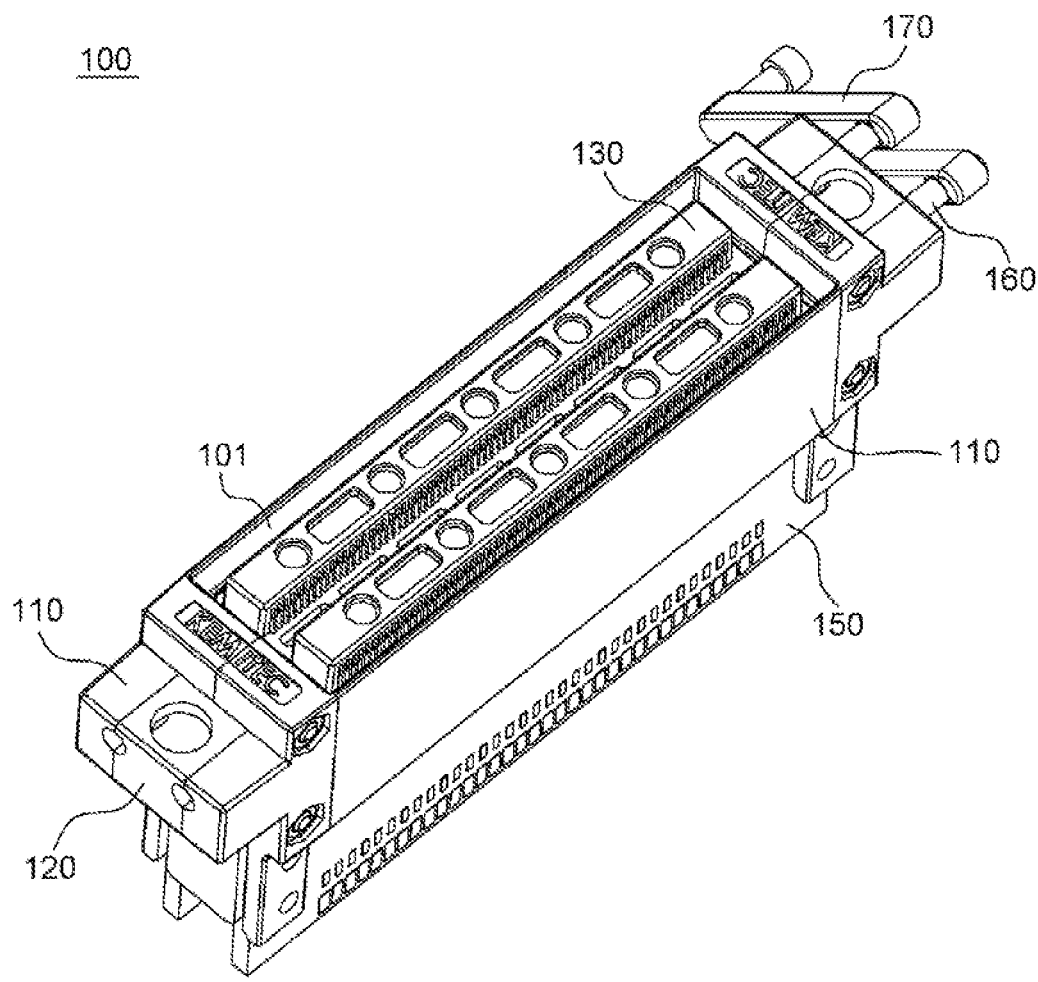
FIG. 10 is a perspective view showing a first connector of a low insertion force connector assembly according to the present invention.
Figure 11:
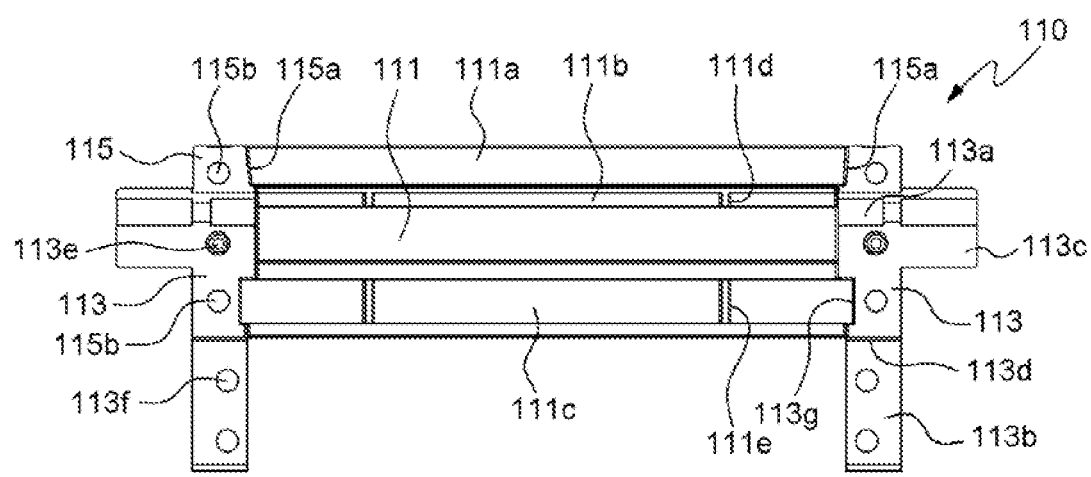
FIG. 11 is a front view showing an outer member of the first connector of FIG. 10.
Figure 12:
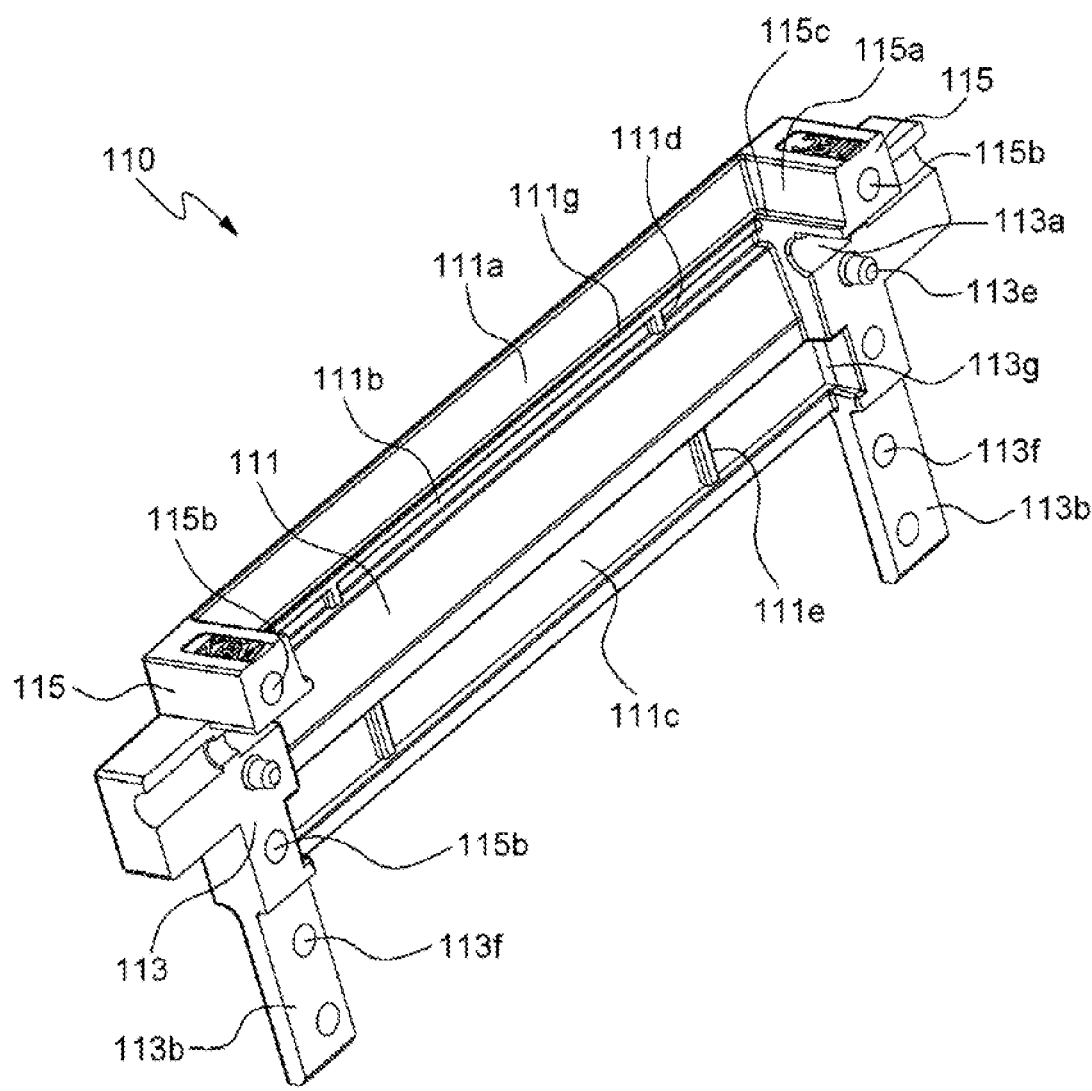
FIG. 12 is a perspective view showing the outer member of the first connector of FIG. 10.
Figure 13:
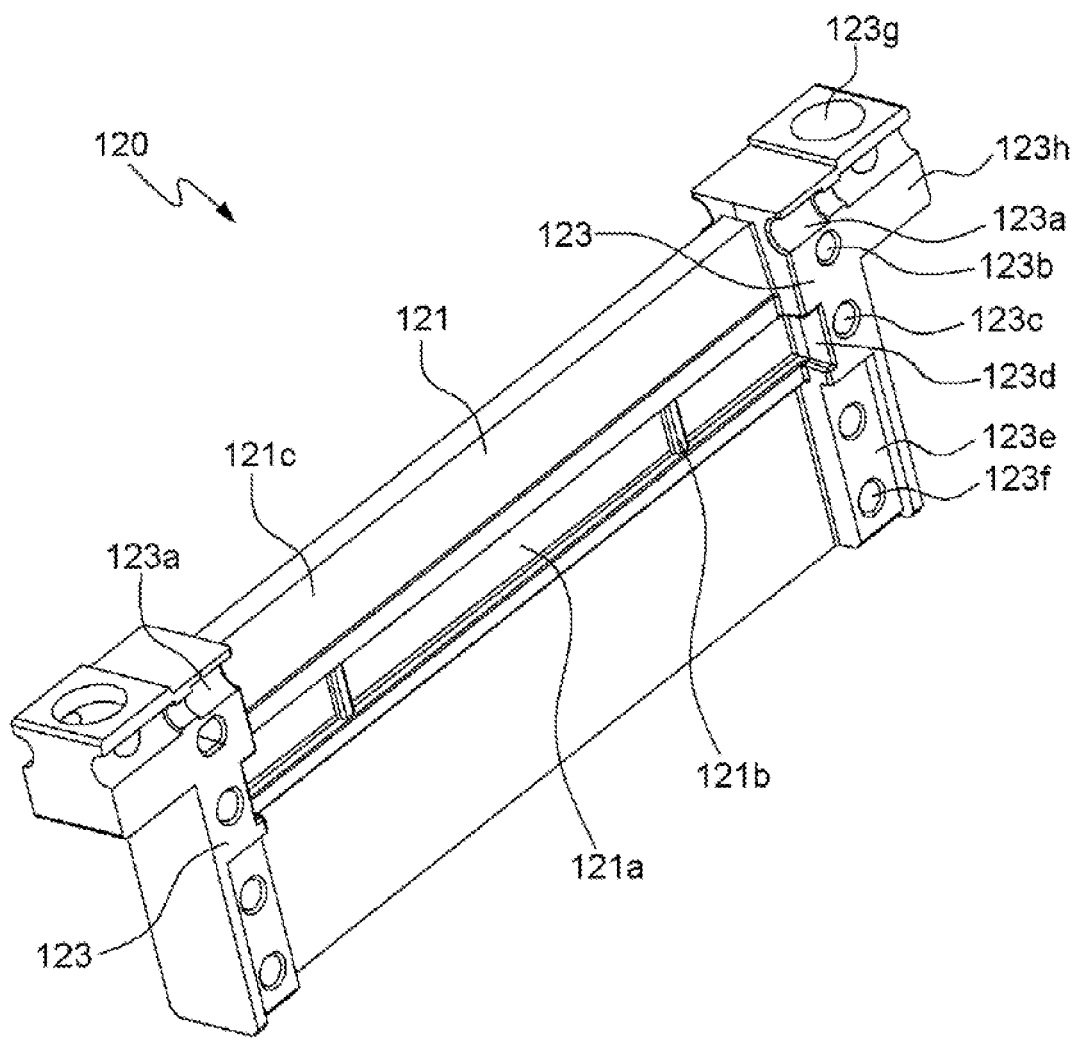
FIG. 13 is a perspective view showing an intermediate member of the first connector of FIG. 10.
Figure 14:
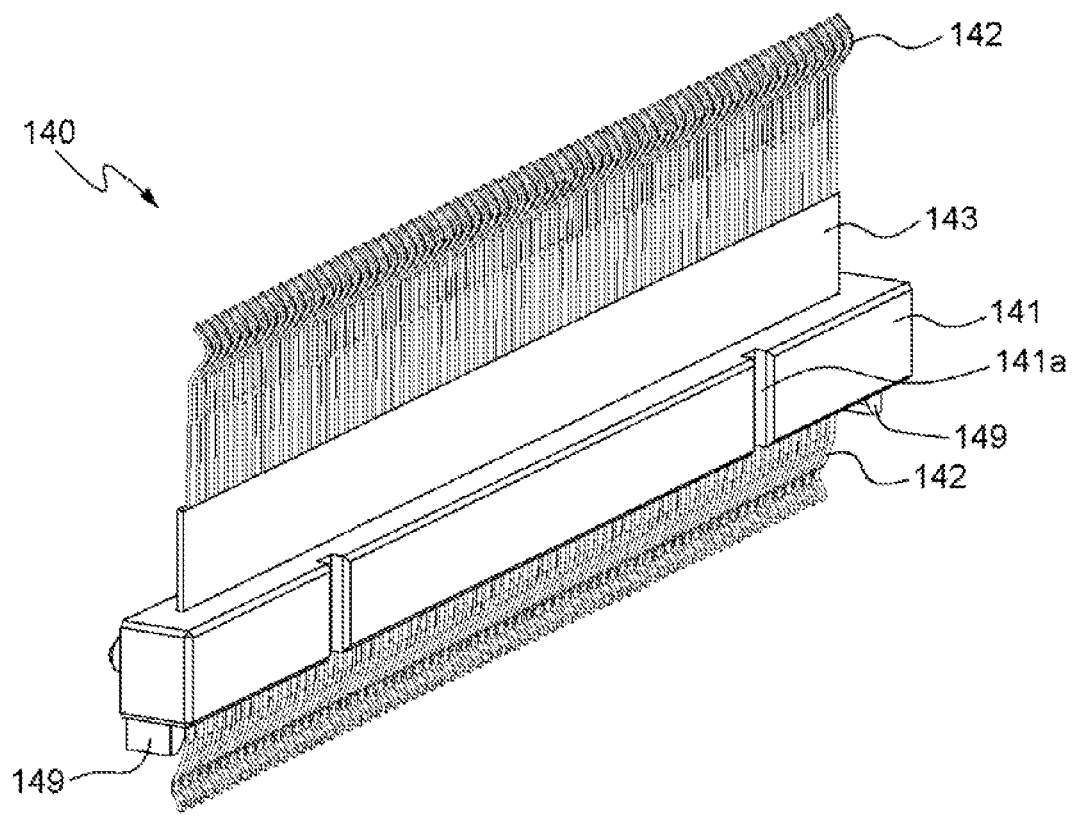
FIGS. 14 and 15 are perspective views showing a pin module of the first connector of FIG. 10.
Figure 15:
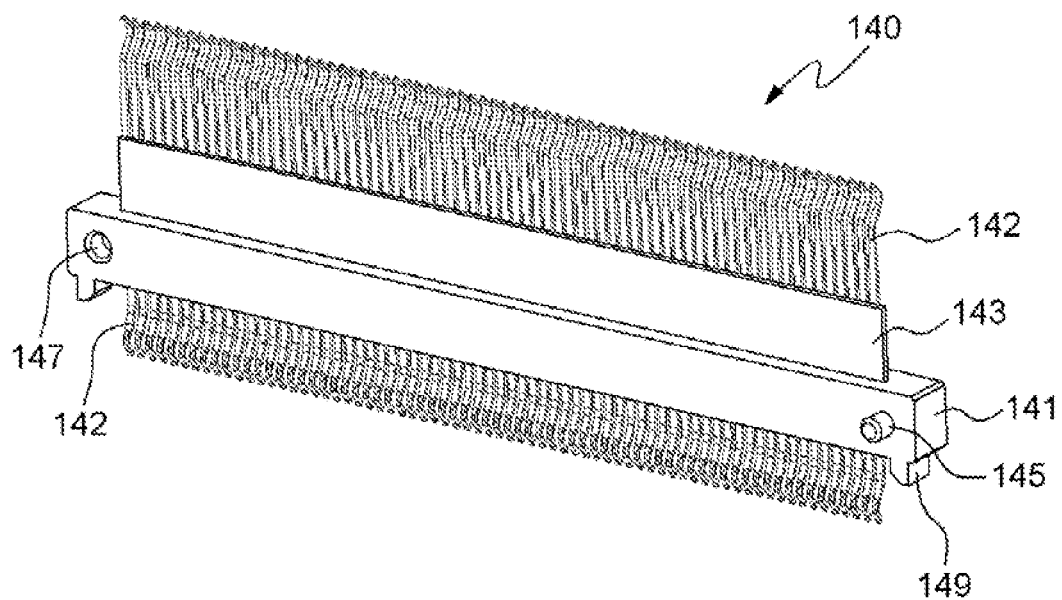
Figure 16:
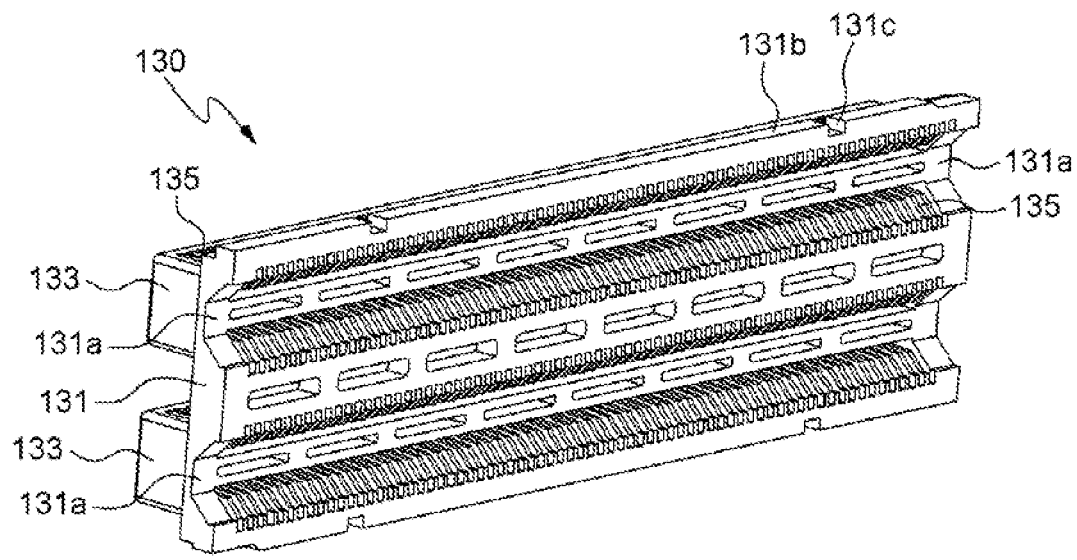
FIG. 16 is a perspective view showing a bottom of a top member of the first connector of FIG. 10.
Figure 17:
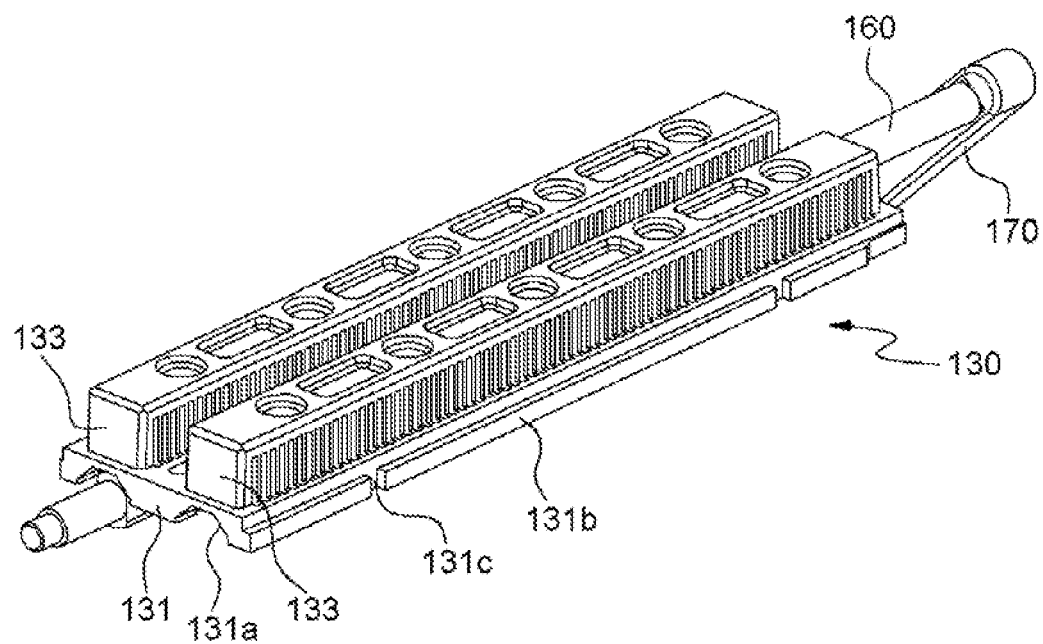
FIG. 17 is a perspective view showing the top member, driving shafts, and handles of the first connector of FIG. 10.
Figure 18:
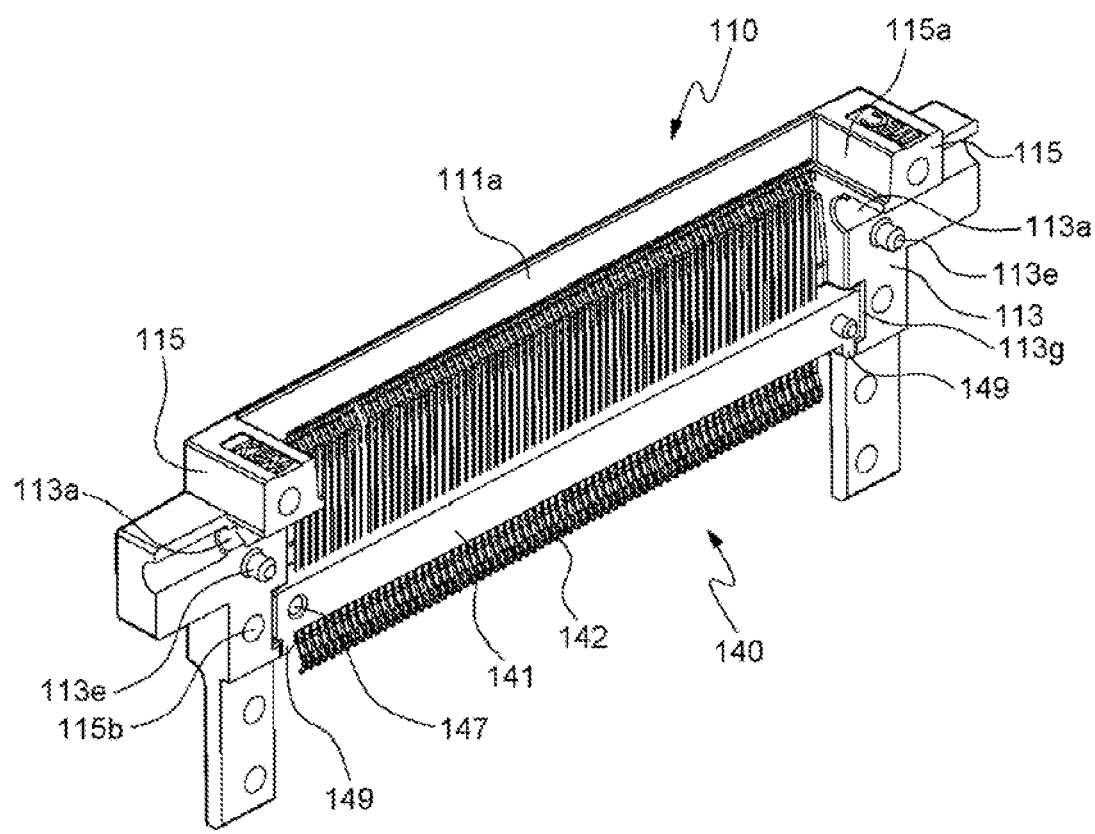
FIGS. 18 and 19 are perspective views showing a state where the pin module is coupled to the outer member of the first connector of FIG. 10.
Figure 19:
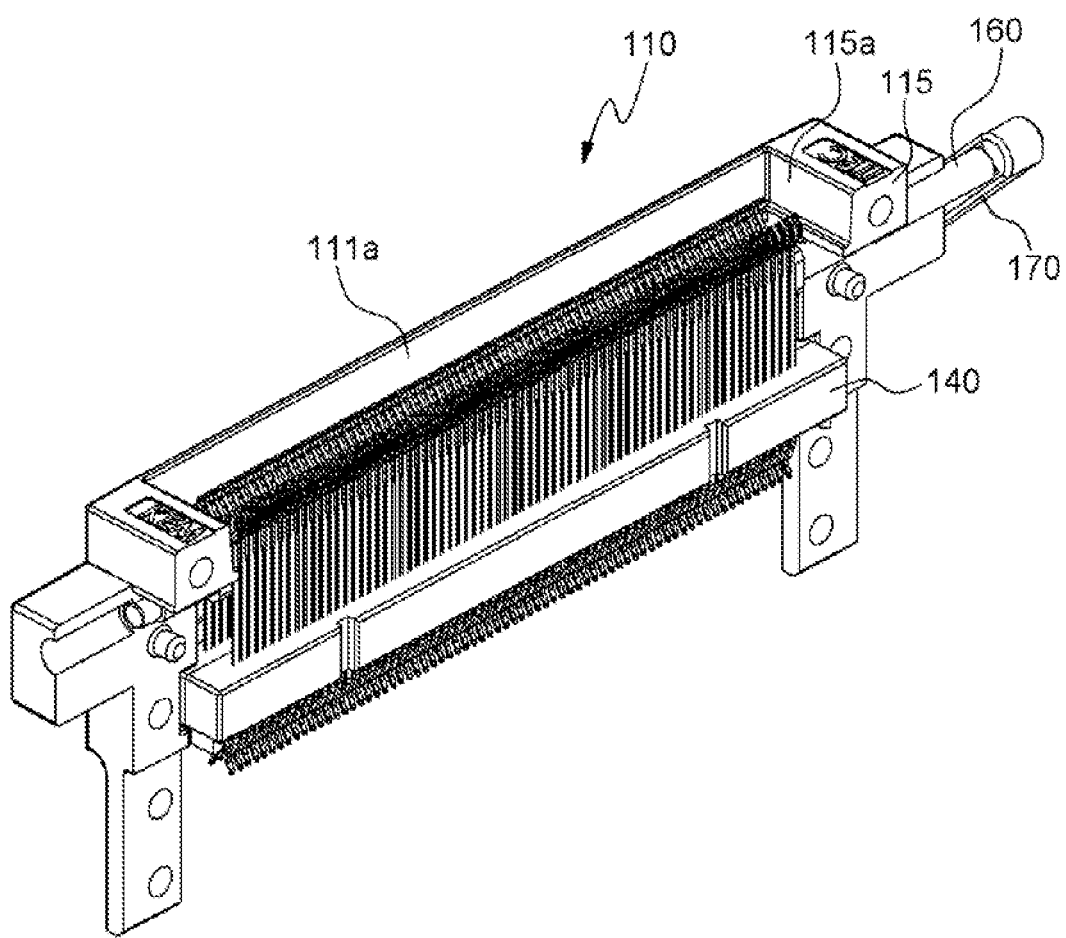
Figure 20:
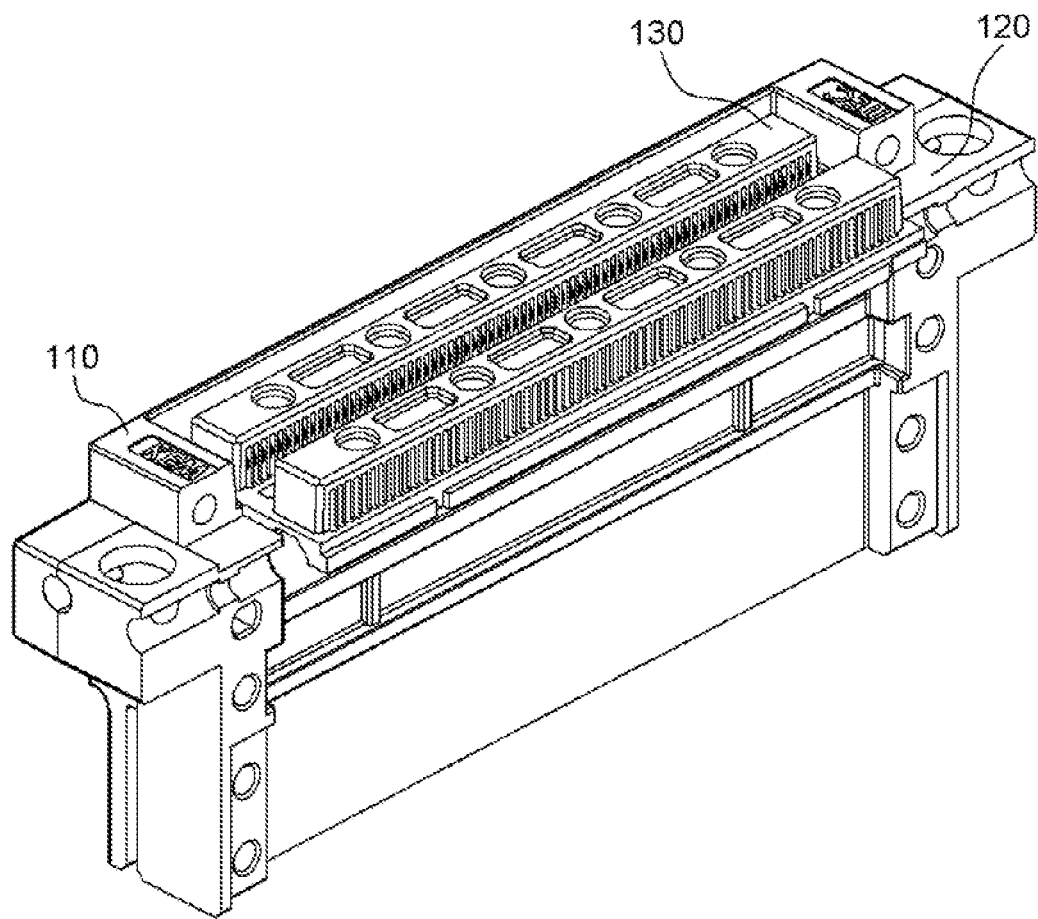
FIG. 20 is a perspective view showing a state where the outer members, the intermediate member, and the top member of the first connector of FIG. 10 are coupled to each other.
Figure 21:
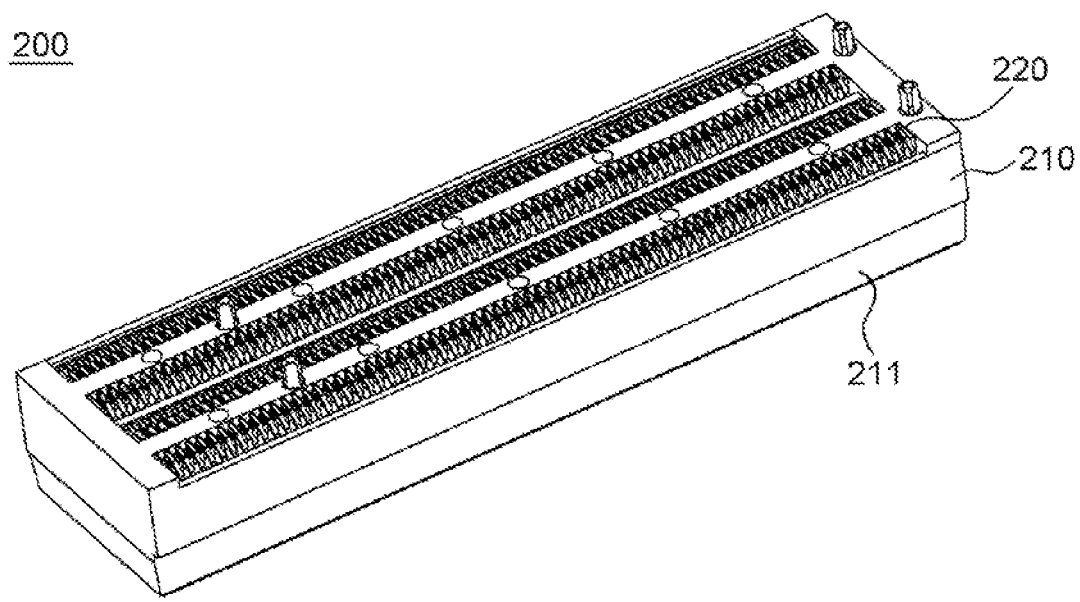
FIG. 21 is a perspective view showing a second connector of the low insertion force connector assembly according to the present invention.
Figure 22:
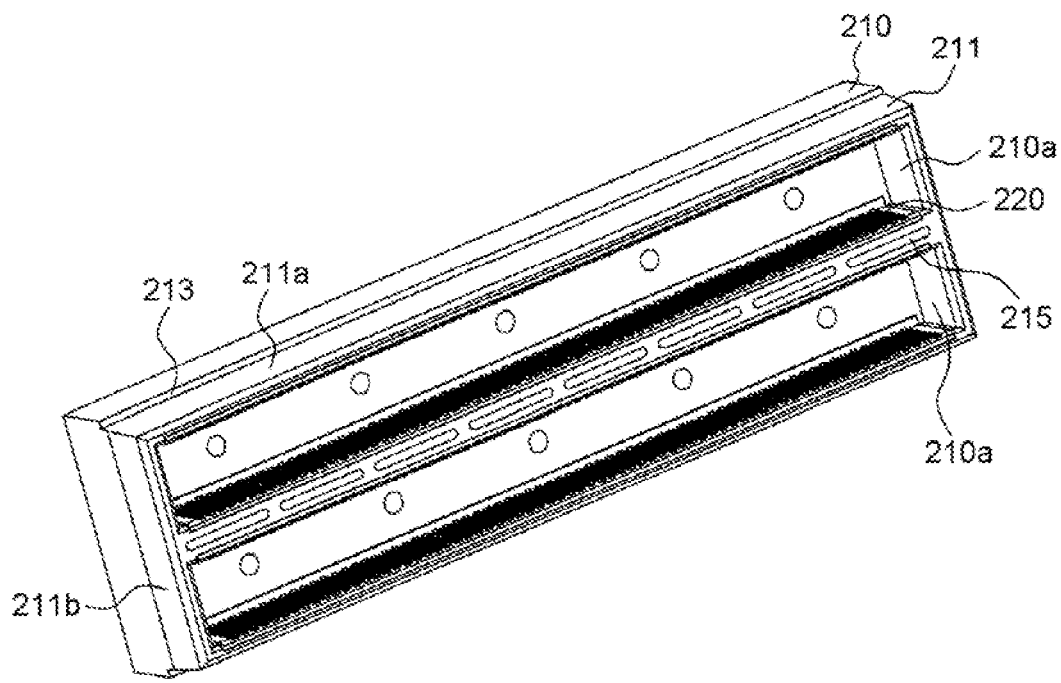
FIG. 22 is a perspective view showing a bottom of the second connector of the low insertion force connector assembly according to the present invention.
Figure 23:
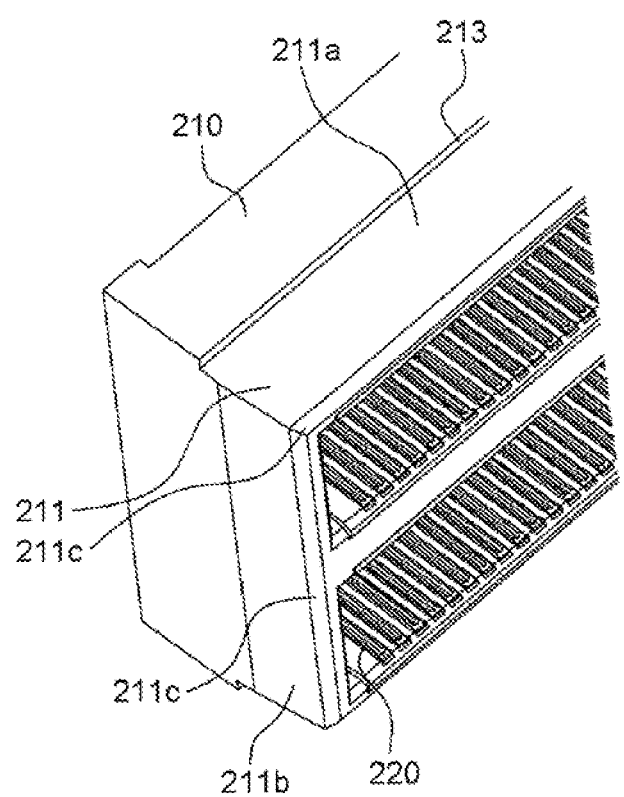
FIG. 23 is a perspective view showing a bottom of a portion of the left end of FIG. 22.
Figure 24:
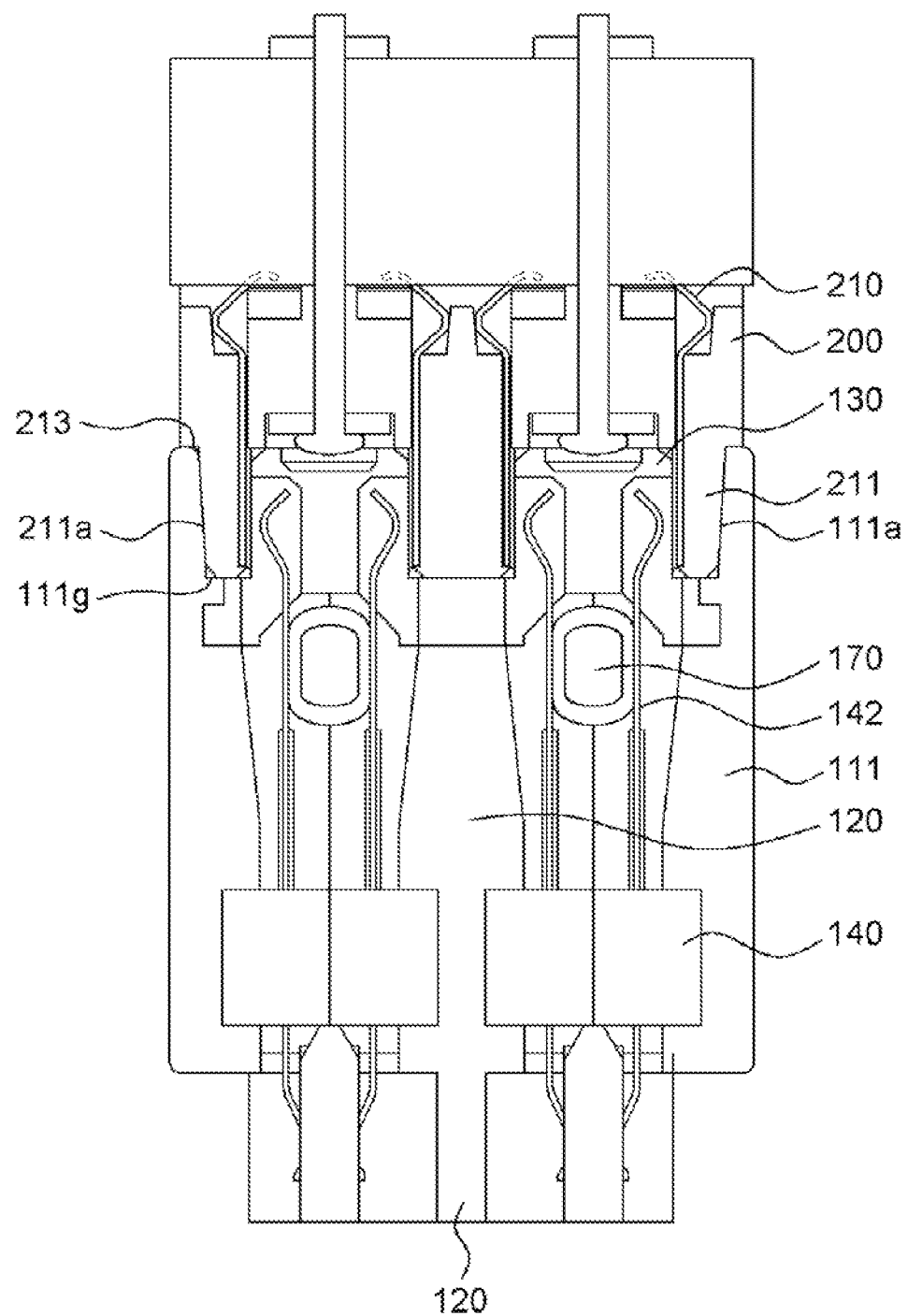
FIG. 24 is a transverse sectional view showing coupling between the first connector and the second connector of the low insertion force connector assembly according to the present invention.
Figure 25:
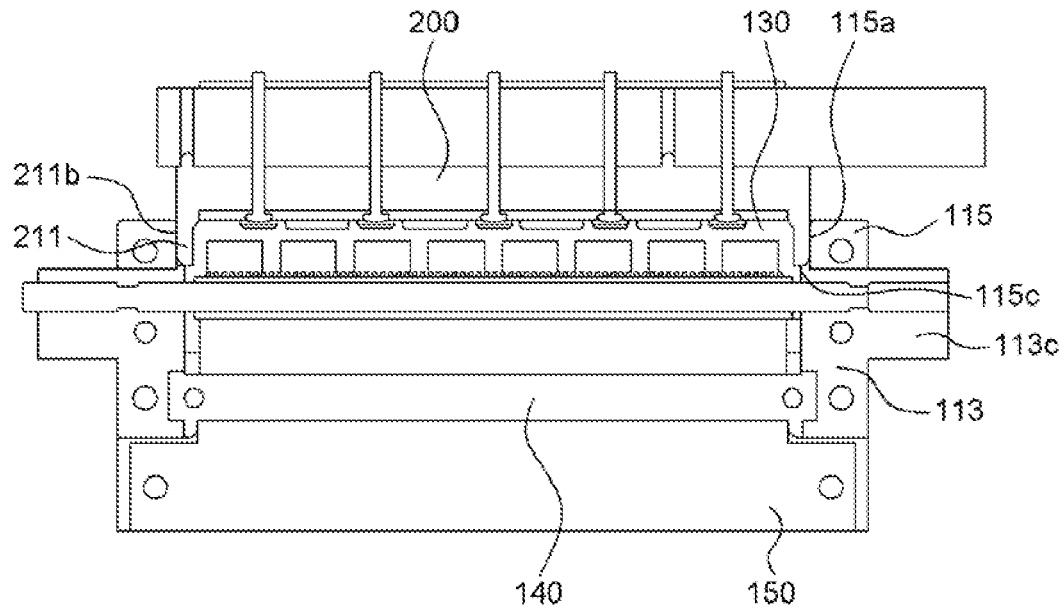
FIG. 25 is a longitudinal sectional view showing coupling between the first connector and the second connector of the low insertion force connector assembly according to the present invention.
Figure 26:
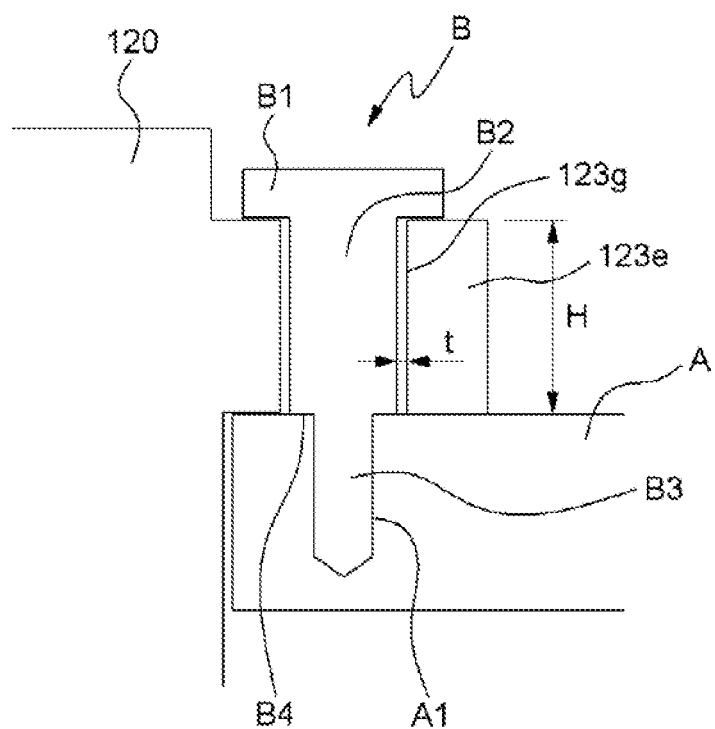
FIG. 26 is a schematic sectional view showing installation of the first connector.
Figure 27:
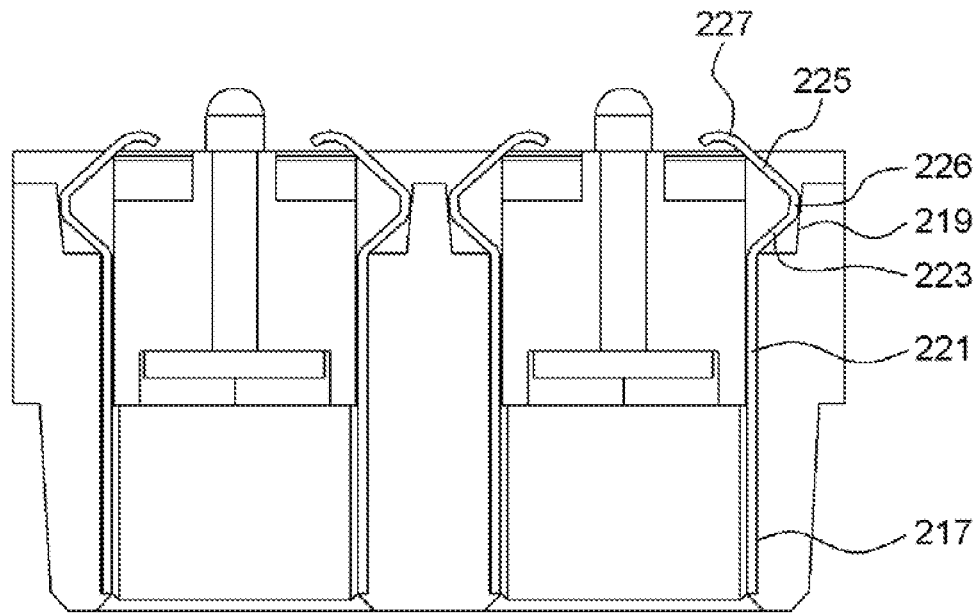
FIG. 27 is a sectional view showing the second connector of the low insertion force connector assembly according to the present invention.
Figure 28:
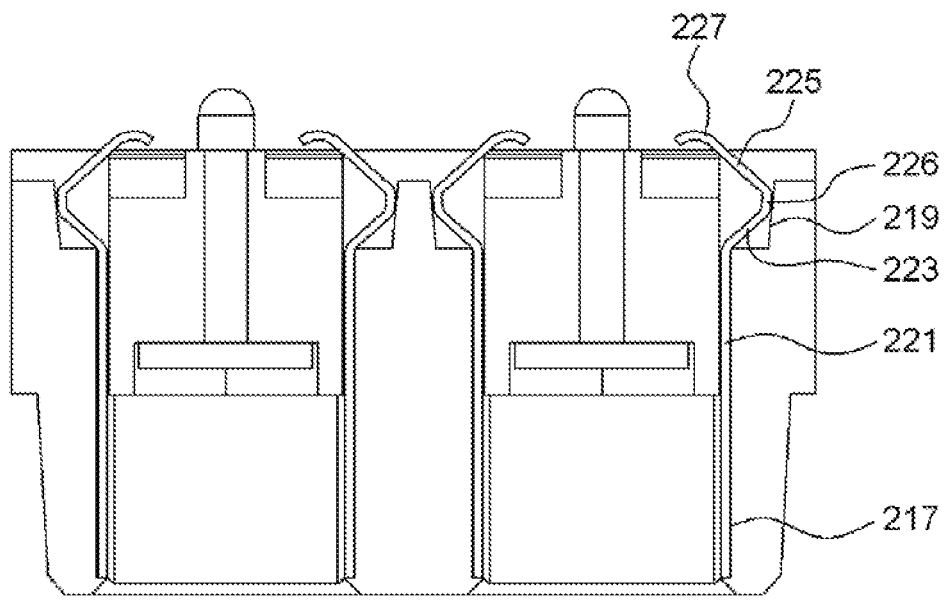
FIGS. 28 and 29 are perspective views showing examples of pins of the second connector of the low insertion force connector assembly according to the present invention.
Figure 29:
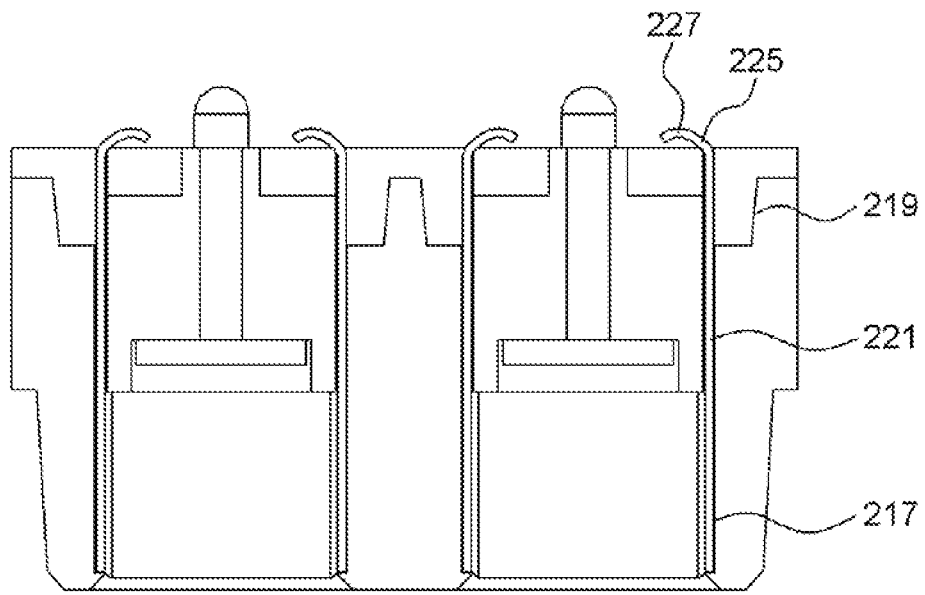

FIG. 10 is a perspective view showing a first connector of a low insertion force connector assembly according to the present invention, FIG. 11 is a front view showing an outer member of the first connector of FIG. 10, FIG. 12 is a perspective view showing the outer member of the first connector of FIG. 10, FIG. 13 is a perspective view showing an intermediate member of the first connector of FIG. 10, FIGS. 14 and 15 are perspective views showing a pin module of the first connector of FIG. 10, FIG. 16 is a perspective view showing a bottom of a top member of the first connector of FIG. 10, FIG. 17 is a perspective view showing the top member, driving shafts, and handles of the first connector of FIG. 10, FIGS. 18 and 19 are perspective views showing a state where the pin module is coupled to the outer member of the first connector of FIG. 10, FIG. 20 is a perspective view showing a state where the outer members, the intermediate member, and the top member of the first connector of FIG. 10 are coupled to each other, FIG. 21 is a perspective view showing a second connector of the low insertion force connector assembly according to the present invention, FIG. 22 is a perspective view showing a bottom of the second connector of the low insertion force connector assembly according to the present invention, FIG. 23 is a perspective view showing a bottom of a portion of the left end of FIG. 22, FIG. 24 is a transverse sectional view showing coupling between the first connector and the second connector of the low insertion force connector assembly according to the present invention, FIG. 25 is a longitudinal sectional view showing coupling between the first connector and the second connector of the low insertion force connector assembly according to the present invention, FIG. 26 is a schematic sectional view showing installation of the first connector, FIG. 27 is a sectional view showing the second connector of the low insertion force connector assembly according to the present invention, and FIGS. 28 and 29 are perspective views showing examples of pins of the second connector of the low insertion force connector assembly according to the present invention.

For the convenience of the description, hereinafter, a direction toward a second connector is called up direction, and a direction toward a first connector down direction. Also, a transverse direction in FIG. 11 is called a longitudinal direction, a vertical direction to the ground transverse direction, and a facing direction of outer members inward direction.

The low insertion force connector assembly according to the present invention includes a first connector 100 and a second connector 200.

As shown in FIGS. 10 to 12, the first connector 100 includes two outer members 110, an intermediate member 120, a top member 130, four pin modules 140, PCBs 150, driving shafts 160, and handles 170.

The first connector 100 has an insertion groove 101 formed on top thereof. The insertion groove 101 has a shape of a rectangular section and is concaved in an up and down direction. The insertion groove 101 includes body inner surfaces 111a facing each other in the transverse direction and side inner surfaces 115a facing each other in the longitudinal direction. A transverse distance between the body inner surfaces 111a and a longitudinal distance between the side inner surfaces 115a are increased toward the open end portion of the insertion groove 101. The insertion groove 101 has protruding portions protruding outward therefrom in such a manner as to be extended in longitudinal directions and spaced apart from each other in the transverse direction.

The outer members 110 are disposed to face each other in the transverse direction of the first connector 100. Each outer member 110 includes a plate-shaped outer member body 111 extended in the longitudinal direction, outer member side portions 113 formed on both ends of the outer member body 111 in the longitudinal direction in such a manner as to protrude inward in the transverse direction, and outer member protrusion portions 115 protruding inward from tops of the outer member side portions 113 in the transverse direction.

On the facing surfaces of the outer member bodies 111 are located body inner surfaces 111a inclinedly extended toward tops thereof in the longitudinal direction. Further, on the facing surfaces of the outer member bodies 111 are formed top member insertion grooves 111b extended downward from the body inner surfaces 111a in the longitudinal direction in such a manner as to be concave inward in the transverse direction. Furthermore, on the facing surfaces of the outer member bodies 111 are formed outer member pin insertion grooves 111c extended downward from the top member insertion grooves 111b in the longitudinal direction in such a manner as to be concavely spaced apart from the top member insertion grooves 111b.

A plurality of top member insertion protrusions 111d protrude inward from the top member insertion grooves 111b in the transverse direction in such a manner as to be spaced apart from each other in the longitudinal direction. A plurality of pin insertion protrusions 111e protrude inward from the outer member pin insertion grooves 111e in the transverse direction in such a manner as to be spaced apart from each other in the longitudinal direction.

Outer member side protrusions 113c protrude from tops of the outer member side portions 113 in the longitudinal direction.

The outer member side portions 113 have outer member axial grooves 113a extended in the longitudinal direction therefrom in such a manner as to be concave inward in the transverse direction. The outer member axial grooves 113a are formed at the positions where the outer member side protrusions 113c are formed in such a manner as to be extended to the outer member side protrusions 113c.

The outer member side portions 113 have outer member protrusions 113e protruding inward in the transverse direction from positions where the outer member side protrusions 113c are formed. Each outer member side portion 113 has outer member coupling holes 115b spaced apart from each other in the up and down direction around the outer member protrusion 113e in such a manner as to be penetrated in the transverse direction. The outer member coupling holes 115b are formed on the outer member protrusion portion 115 and the outer member side portion 113, respectively.

The outer member side portions 113 have outer member lower protrusions 113b extended more downward than the outer member body 111 therefrom in such a manner as to form downward protruding surfaces. The outer member lower protrusions 113b have PCB fastening holes 113f penetrated thereinto in the transverse direction. One or more PCB fastening holes 113f are spaced apart from each other in the up and down direction.

The outer member side portions 113 have concave side support surfaces 113g facingly formed concavely at the position where the outer member pin insertion groove 111c is formed in the longitudinal direction. The concave side support surfaces 113g whose end portions are connected to the outer member pin insertion groove 111c.

As shown in FIGS. 10 and 13, the intermediate member 120 is disposed between the outer members 110 in the transverse direction. The intermediate member 120 has a plate-shaped intermediate member body 121 extended in the longitudinal direction and intermediate member side portions 123 are formed on both longitudinal ends of the intermediate member body 121 in such a manner as to protrude in the transverse direction.

The intermediate member body 121 has first intermediate member surfaces 121c formed slantly on both transverse sides thereof in such a manner as to become increased in thickness from the top to the bottom and intermediate member pin insertion grooves 121a concavely formed spaced apart from the first intermediate member surfaces 121c in the down direction at positions facing the outer member pin insertion grooves 111c in such a manner as to be extended in the longitudinal direction. The intermediate member pin insertion groove 121a has a plurality of intermediate member pin protrusions 121b spaced apart from each other in the longitudinal direction in such a manner as to protrude therefrom toward the outer members 110 in the transverse direction.

Tops of the intermediate member side portions 123 protrude more upward than top of the intermediate member body 121. The intermediate member side portions 123 have intermediate member side protrusions 123h protruding from tops thereof in the longitudinal direction.

On both transverse sides of the intermediate member side portions 123 are formed intermediate member axial grooves 123a extended in the longitudinal direction therefrom in such a manner as to be concave inward in the transverse direction. The outer member axial grooves 113a are formed at the positions where the intermediate member side protrusions 123h are formed in such a manner as to be extended to the outer member side protrusions 123h. The outer member side protrusions 123h have first connector fastening holes 123g penetrated thereinto in the up and down direction.

On both transverse sides of the intermediate member side portions 123 are formed outer member protrusion grooves 123b are concavely formed in such a manner as to insert the outer member protrusions 113e. Intermediate member coupling holes 123c are spaced apart from the outer member protrusion grooves 123b in the down direction in such a manner as to be penetrated thereinto in the transverse direction at the positions where the outer member coupling holes 115b of the outer member side portions 113 are formed.

The intermediate member side portions 123 have concave intermediate member support surfaces 123*d* facingly formed concavely at the positions where the intermediate member pin insertion grooves 121*a* are formed in the longitudinal direction in such a manner as to connect end portions thereof to the intermediate member pin insertion grooves 121*a*.

The intermediate member side portions 123 have PCB seating portions 123*e* formed by reducing thicknesses of the insides thereof in the longitudinal direction in such a manner as to form inward and downward protruding surfaces. The PCB seating portions 123*e* have PCB fastening holes 123*f* penetrated thereinto in the transverse direction. The PCB fastening holes 123*f* communicate with the PCB fastening holes 113*f* of the outer members 110.

As shown in FIGS. 14 and 15, the two pin modules 140 are disposed between the intermediate member 120 and one side outer member 110 and the two pin modules 40 are disposed between the intermediate member 120 and the other outer member 110 on both transverse sides of the intermediate member 130.

Each pin module 140 includes a bar-shaped pin module body 141 extended in the longitudinal direction, a plate-shaped pin module support 143 extended upward from the pin module body 141 in the longitudinal direction, and a plurality of pins 142 arranged in the longitudinal direction and penetrated into the pin module body 141 and the pin module support 143 in the up and down direction in such a manner as to allow top ends thereof to protrude upward from the pin module support 143 and to allow bottom ends thereof to protrude downward from the pin module body 141.

The pin module 140 includes a pin module coupling groove 147 and a pin module coupling protrusion 145 formed on one side of the pin module body 141 coming into contact with the pin module 140 adjacent thereto in such a manner as to be spaced apart from each other in the longitudinal direction. The pin module coupling groove 147 and the pin module coupling protrusion 145 are spaced apart from each other in the longitudinal direction of the pin module 140. The pin module coupling protrusion 145 of the adjacent pin module 140 is inserted into the pin module coupling groove 147, and the pin module coupling groove 147 of the adjacent pin module 140 inserts the pin module coupling protrusion 145 thereinto.

A plurality of concave pin module body grooves 141*a* are spaced apart from each other in the longitudinal direction on the opposite transverse surface to the surface where the pin module coupling groove 147 and the pin module coupling protrusion 145 of the pin module body 141 are formed in such a manner as to be concavely penetrated in the up and down direction.

The pin module body 141 has pin module protrusion portions 149 protruding downward from both longitudinal sides thereof in such a manner as to locate the plurality of pins 142 therebetween. The lower ends of the pin module protrusion portions 149 are slant downward therefrom.

As shown in FIGS. 16 and 17, the top member 130 whose both transverse sides are inserted into the outer members 110 so that the top member 130 is disposed on top of the intermediate member 120. The top member 130 includes a bar-shaped top member body 131 extended in the longitudinal direction and top member protruding portions 133 protruding upward from the top member body 131 in such a manner as to be spaced apart from each other in the transverse direction and extended in the longitudinal direction.

The top member body 131 has top member concave portions 131*a* concave downward from the underside thereof in such a manner as to be extended in the longitudinal direction. The two top member concave portions 131*a* are spaced apart from each other in the transverse direction. The top member concave portions 131*a* whose both transverse sides are slant toward the lower portions thereof so that a distance between both transverse sides becomes distant.

Top member pin holes 135 are extended from the top member concave portions 131*a* to the top member protruding portions 133 in such a manner as to be exposed toward the transverse direction of the top member protruding portions 133. The top member pin holes 135 are formed in four rows so that the two rows thereof are formed on one top member concave portion 131*a* and one top member concave portion 131*a* and the two rows thereof are formed on the other top member concave portion 131*a* and the other top member concave portion 131*a*.

Top member body protrusions 131*b* protrude from both transverse sides of the top member body 131 in the transverse direction in such a manner as to be inserted into the top member insertion grooves 111*b*. A plurality of concave top member protrusion grooves 131*c* are spaced apart from each other on each top member body protrusion 131*b* in the longitudinal direction in such a manner as to be penetrated in the up and down direction.

The two driving shafts 160 are rotatably disposed between the intermediate member 120 and the outer members 110 under the top member 130 and have end portions protruding from one longitudinal side. Each driving shaft 160 has a shape of an oval section in such a manner as to be extended in the longitudinal direction.

The handles 170 are disposed on the protruding end portions of the driving shafts 160. Each handle 170 includes a first handle extended in a vertical direction to the corresponding driving shaft 160 and a second handle spaced apart from a coupled portion between the driving shaft 160 and the first handle in the vertical direction to the driving shaft 160 in such a manner as to be extended in the longitudinal direction.

So as to assemble the first connector 100, as shown in FIG. 18, the pin modules 140 are first coupled to the outer members 110. In detail, the pin module bodies 141 of the pin modules 140 are inserted into the outer member pin insertion grooves 111*c*, and the pin insertion protrusions 111*e* are inserted into the pin module body grooves 141*a*. Movements of the pin modules 140 in the longitudinal direction are prevented through the pin insertion protrusions 111*e* and the pin module body grooves 141*a*.

Also, the pin insertion protrusions 111*e* are slantly formed in such a manner as to become reduced in thickness in the longitudinal direction as they are extended inward in the transverse direction, and as the pin module support 143 is distant from the transverse sides of the pin module body grooves 141*a*, an inclined surface is formed so that a distance between their transverse sides becomes long, thereby allowing the pin modules 140 to be easily coupled to the outer member 110.

One pin module 140 is coupled to the pin module 140 coupled to the outer member 110. The pin module coupling protrusion 145 of the adjacent pin module 140 is inserted into the pin module coupling groove 147 of the pin module 140, and the pin module coupling groove 147 of the adjacent pin module 140 inserts the pin module coupling protrusion 145 of the pin module 140 thereinto.

Both longitudinal ends of the pin module body 141 of one side pin module 140 of the two pin modules 140 come into contact with the concave side support surfaces 113*g*, and both longitudinal ends of the pin module body 141 of the other side pin module 140 come into contact with the concave intermediate member support surfaces 123d.

As a result, the two pin modules 140 disposed between the intermediate member 120 and the outer member 110 are more rigidly seated onto the intermediate member 120 and the outer member 110, so that changes in position according to their operations are prevented to allow the electrical contacts of the pins to be stably maintained.

As shown in FIG. 19, each driving shaft 160 is inserted into the outer member axial grooves 113a in such a manner as to be rotatably disposed between the pin modules 140. The driving shaft 160 is rotated between the pins 142 spaced apart from each other in the transverse direction to pressurize the pins 142 outward in the transverse direction. The handle 170 is disposed on the portion of the driving shaft 160 protruding outward in the longitudinal direction of the outer member 110.

The outer member 110 and the intermediate member 120, to which the pin modules 140 are coupled, are then coupled to each other. The pin module body 141 of the pin module 140 is inserted into the intermediate member pin insertion groove 121a, and the intermediate member pin protrusions 121b are inserted into the pin module body grooves 141a. Through the intermediate member pin protrusions 121b and the pin module body grooves 141a, the pin module 140 is prevented from being moved in the longitudinal direction.

Also, the intermediate member pin protrusions 121b are slantly formed in such a manner as to become reduced in thickness in the longitudinal direction as they are toward the outer member 110 in the transverse direction, and as the pin module support 143 is distant from the transverse sides of the pin module body grooves 141a, an inclined surface is formed so that a distance between their transverse sides becomes long, thereby allowing the pin modules 140 to be easily coupled to the outer member 110.

The PCBs 150 are disposed between one side outer member 110 and the intermediate member 120 adjacent to each other and between the other side outer member 120 and the intermediate member 120 adjacent to each other. Each PCB 150 has electrical terminals adapted to transfer electrical signals. Screws are fastened to PCB holes formed on the PCBs 150, the PCB fastening holes 113f of the outer members 110, and the PCB fastening holes 133f of the intermediate member 120, so that the PCBs 150 are coupled to the outer members 110 and the intermediate member 120.

The outer member side portions 113 of the outer member 110 come into contact with the intermediate member side portions 123 of the intermediate member 120, thereby allowing coupling therebetween. Further, the end portions of the outer member axial grooves 113a come into contact with the intermediate member axial grooves 123a to form one shaft hole, so that the driving shaft 160 is rotatably inserted into the shaft hole.

As shown in FIG. 20, both transverse sides of the top member 130 are inserted into the outer members 110 in such a manner as to be disposed on top of the intermediate member 120.

The top member body protrusions 131b of the top member 130 are inserted into the top member insertion grooves 111b of the outer members 110, and the top member insertion protrusions 111d are inserted into the top member protrusion grooves 131c. Through the top member insertion protrusions 111d and the top member protrusion grooves 131c, the top member 130 is prevented from being moved in the longitudinal direction.

The two pin modules 140 are located at each top member concave portion 131a of the top member 130, so that the pins 142 are inserted into the top member pin holes 135. The pins 142 are exposed to the transverse sides of the top member protrusions 133 in such a manner as to be arranged in the longitudinal direction.

In the same manner as described with reference to FIGS. 18 to 20, to the opposite side of the intermediate member 120 are coupled the two pin modules 140, the driving shaft 160 disposed between the pin modules 140, the handle 170 disposed on the driving shaft 160, and the outer member 110. The outer members 110 located on both transverse sides of the intermediate member 120 are coupled to each other in such a manner as to allow the end portions of the outer member protrusion portions 115 to come into contact with each other.

The first connector 100 has the insertion groove 101 formed on top thereof. The insertion groove 101 is defined by the body inner surfaces 111a formed on the outer member body 111 in such a manner as to face each other in the transverse direction and the side inner surfaces 115a formed on the outer member protrusion portions 115 in such a manner as to face each other in the longitudinal direction. The insertion groove 101 has a shape of a rectangular section and is concave upward. A transverse distance between the body inner surfaces 111a and a longitudinal distance between the side inner surfaces 115a are increased toward the open end portion of the insertion groove 101.

As shown in FIGS. 21 to 23, the second connector 200 includes a connector body 210 and a plurality of pins 220.

The connector body 210 has a shape of a rectangular section in such a manner as to be extended in the longitudinal direction, and a connector insertion portion 211 is extended downward from a connector projection surface 213 protruding downward from the underside of the connector body 210.

The connector body 210 has two connector concave portions 210a formed on the lower portion thereof in such a manner as to be open downward to insert the top member protruding portions 133. The two connector concave portions 210a are spaced apart from each other in the transverse direction.

First insertion surfaces 211a as the outer surfaces of the connector insertion portion 211 extended in the transverse direction and second insertion surfaces 211b as the outer surfaces of the connector insertion portion 211 extended in the longitudinal direction are formed in such a manner as to allow a distance between the first insertion surfaces 211a and a distance between the second insertion surfaces 211b to become reduced as they go toward the ends of the connector insertion portion 211. The connector insertion portion 211 has slant insertion surfaces 211c formed along the end edges thereof.

As shown in FIG. 27, the connector body 210 has connector body pin holes 217 formed thereon in such a manner as to be extended upward and open on the top thereof and to allow bottoms thereof to communicate with the connector concave portions 210a. The connector body pin holes 217 are formed on both transverse sides of each connector concave portion 210a in such a manner as to be spaced apart from each other in the longitudinal direction. The connector body pin holes 217 communicate with the connector concave portions 210a in the directions facing the transverse directions of the connector concave portions 210a. Each connector body pin hole 217 has an expanded pin hole portion 219 expanded in the transverse direction from the top thereof. The expanded pin hole portions 219 are expanded toward both transverse sides thereof, while placing the respective connector concave portions 210a therebetween.

The pins 220 are inserted into the connector body pin holes 217 in such a manner as to allow top ends thereof to protrude upward from the top of the connector body 210 and to allow bottom ends thereof to be exposed to the connector concave portions 210a through the connector body pin holes 217. The pins 220 are arranged in the longitudinal direction on both transverse sides of each connector concave portion 210a. The pins 220 are arranged on each connector concave portion 210a in two rows, and accordingly, the pins 220 are arranged on the respective connector concave portions 210a in four rows.

Hereinafter, a transverse side toward the center of the connector concave portion 210a is called transverse inside (or transversely inward side), and a side toward transversely facing surfaces of the connector concave portion 210a is called transverse outside (or transversely outward side).

Each pin 220 includes a first bar-shaped pin portion 221 extended in the up and down direction, a second pin portion 223 bent from top of the first pin portion 221 in such a manner as to allow an end portion thereof to be slantly extended toward the expanded direction of the expanded pin hole portion 219, a third pin portion 225 bent from top of the second pin portion 223 in such a manner as to allow an end portion thereof to be slantly extended toward the opposite direction to the second pin portion 223, and a fourth pin portion 227 bent from top of the third pin portion 225 in such a manner as to allow an end portion thereof to be slant toward the connector body 210. The bent portions of the pin 220 are curvedly formed.

The first pin portion 221 in each connector body pin hole 217 is located at the connector concave portion 210a in such a manner as to be exposed in the transverse direction of the connector concave portion 210a, the bent portion between the second pin portion 223 and the third pin portion 225 comes into contact with the side of the expanded pin hole portion 219, and the bent portion between the third pin portion 225 and the fourth pin portion 227 and the fourth pin portion 227 are exposed to the outside of the connector body 210.

The bent portion between the third pin portion 225 and the fourth pin portion 227 are located closer at the transverse inside of the connector body 210 than the bent portion between the second pin portion 223 and the third pin portion 225.

A distance between the bent portions between the third pin portion 225 and the fourth pin portion 227 of the pins facing in each connector concave portion 210a is shorter than a transverse width of the connector concave portion 210a.

When the bent portion between the third pin portion 225 and the fourth pin portion 227 is contactedly pressurized, an external force is generated to allow displacement to be applied to the first pin portion 221 toward the transverse outside, so that the first pin portion 221 comes into close contact with the connector body pin hole 217.

As shown in FIG. 28, the pin 220 further includes an upward expanded portion 226 expanded upward between the second pin portion 223 and the third pin portion 225 in such a manner as to be parallel with the first pin portion 221. The upward expanded portion 226 comes into contact with the vertical inner surface of the expanded pin hole portion 219, and otherwise, it may be separated therefrom with a fine tolerance.

As shown in FIG. 29, the pin 220 is configured to allow the third pin portion 225 and the fourth pin portion 227 to protrude upward from the connector body 210 and otherwise to allow a portion of a top of the first pin portion 221, the third pin portion 225 and the fourth pin portion 227 to protrude upward from the connector body 210.

As shown in FIGS. 24 and 25, the connector insertion portion 211 of the second connector 200 is coupledly inserted into the insertion groove 101 of the first connector 100. The top member protruding portions 133 are inserted into the connector concave portions 210a, and the ends of the connector insertion portion 211 are coupledly located between the outer members 110 and the top member 130.

When the connector insertion portion 211 is inserted into the insertion groove 101, the second connector 200 can be easily coupled to the first connector 100 through the first insertion surfaces 211a and the second insertion surfaces 211b slant of the connector insertion portion 211. Through the slant insertion surfaces 211c of the connector insertion portion 211, the top end portions of the insertion groove 101, which are coupled to the slant insertion surfaces 211c, can be easily adjusted in position.

The pins 142 of the first connector 100 and the pins 220 of the second connector 200 are facingly arranged in the transverse direction.

As shown in FIG. 26, a test head A is built on the first connector 100 by means of a bolt B. The bolt B is inserted into the first connector fastening hole 123g of the first connector 100 and is then fastened to a fastening portion A1 of the test head A.

The bolt B includes a bolt head portion B1, a bolt guide portion B2 having a protruding surface from the bolt head portion B in such a manner as to be extended downward, and a bolt fastening portion B3 having a bolt protruding portion B4 from the bolt guide portion B2 in such a manner as to be extended downward and screw-fastened to the fastening portion A1 of the test head A.

If the bolt fastening portion B3 of the bolt B is screw-fastened to the test head A, the bolt protruding portion B4 pressurizes the test head A so that the first connector 100 located between the bolt head portion B1 and the test head A is coupled to the test head A.

The first connector 100 is slidable laterally between the bolt head portion B1 and the test head A, and a tolerance t is formed laterally between the bolt guide portion B2 and the first connector fastening hole 123g. Even if the connector insertion portion 211 and the insertion groove 101 are misaligned in position at the time when the second connector 200 is inserted into the first connector 100, the first connector 100 is moved by means of the clearance t to allow the connector insertion portion 211 and the insertion groove 101 to be automatically aligned, thereby achieving easy coupling.

Hereinafter, an explanation on a semiconductor component test apparatus according to the present invention will be in detail given with reference to FIGS. 36 to 40.

Figure 36:
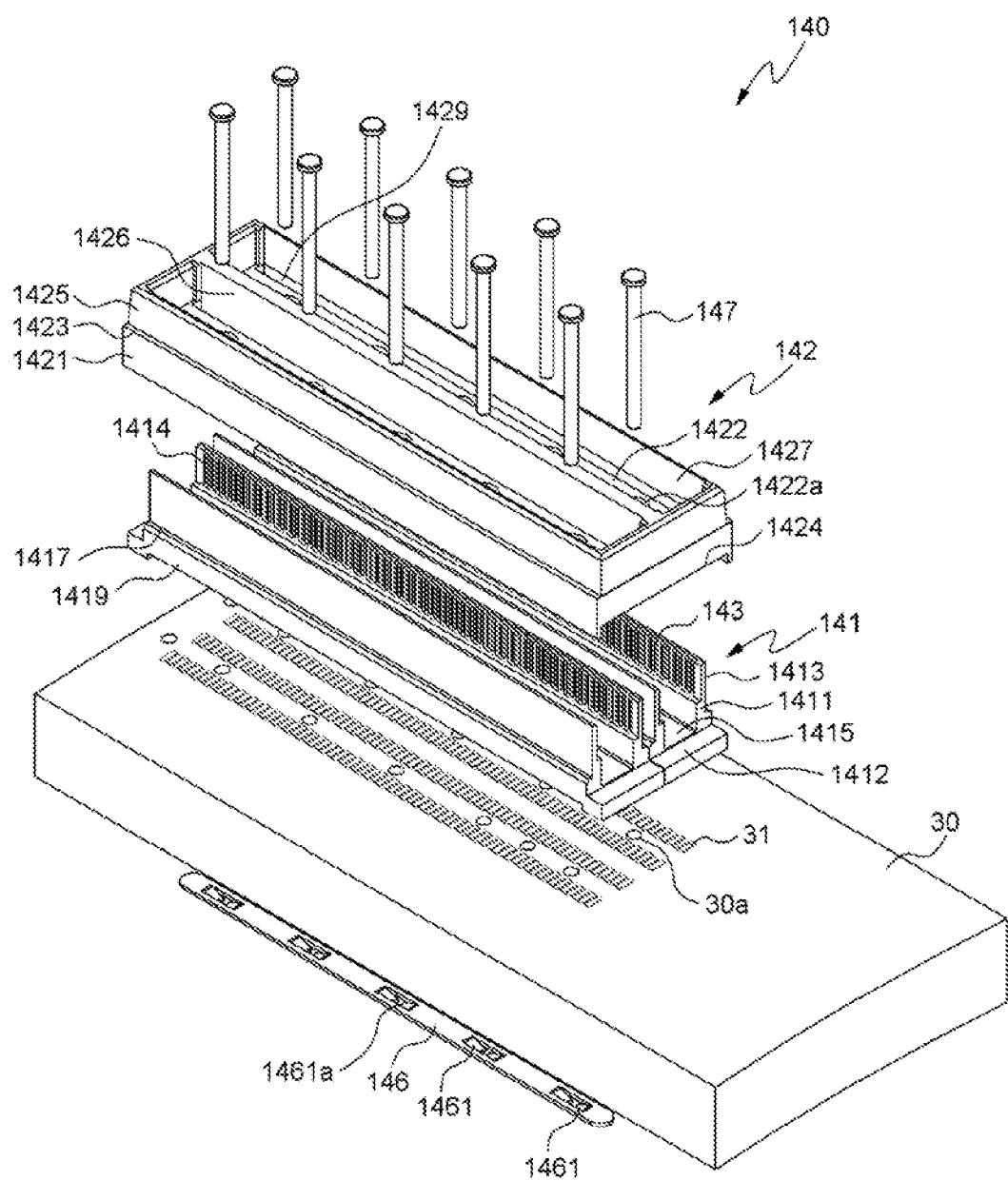
FIG. 36 is an exploded perspective view showing connection between a connection component and a substrate in a semiconductor component test apparatus according to the present invention.
Figure 37:
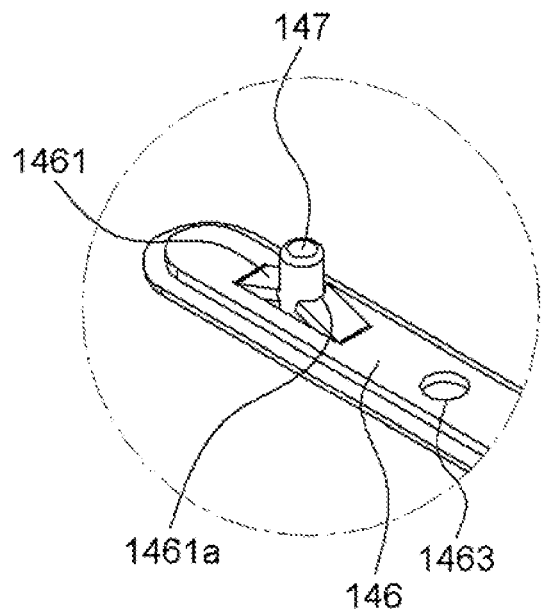
FIG. 37 is a perspective view showing a portion of a coupled state between fixing pins and coupling members of the connection component.
Figure 38:
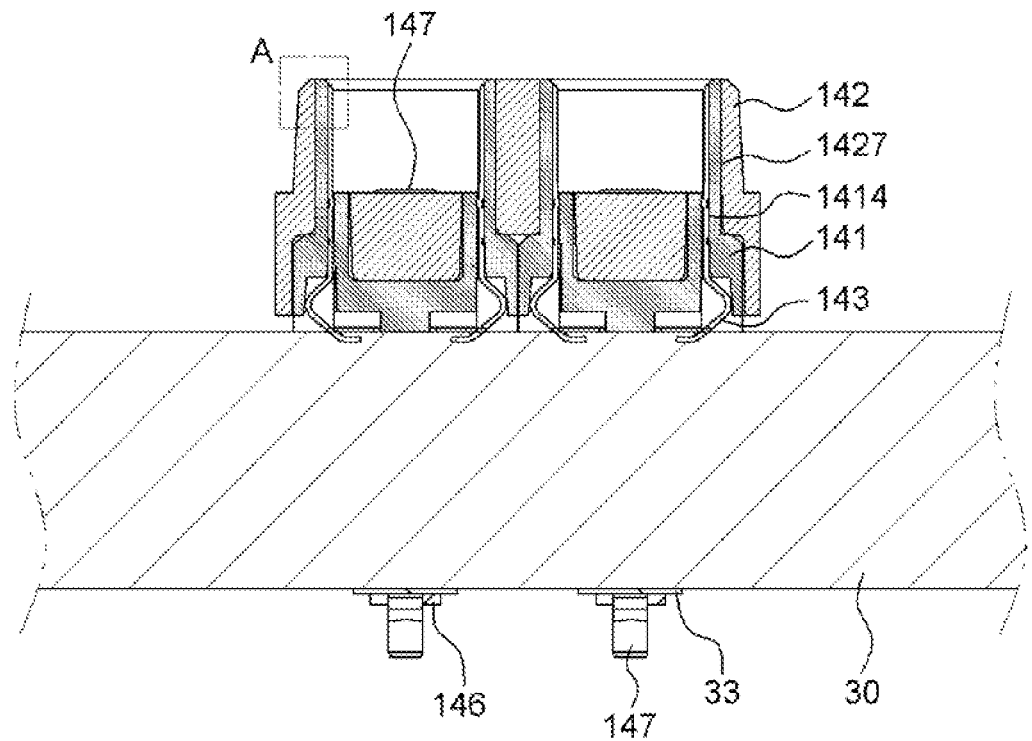
FIG. 38 is a sectional view showing a portion of a coupled state between the connection component and the substrate.
Figure 39:
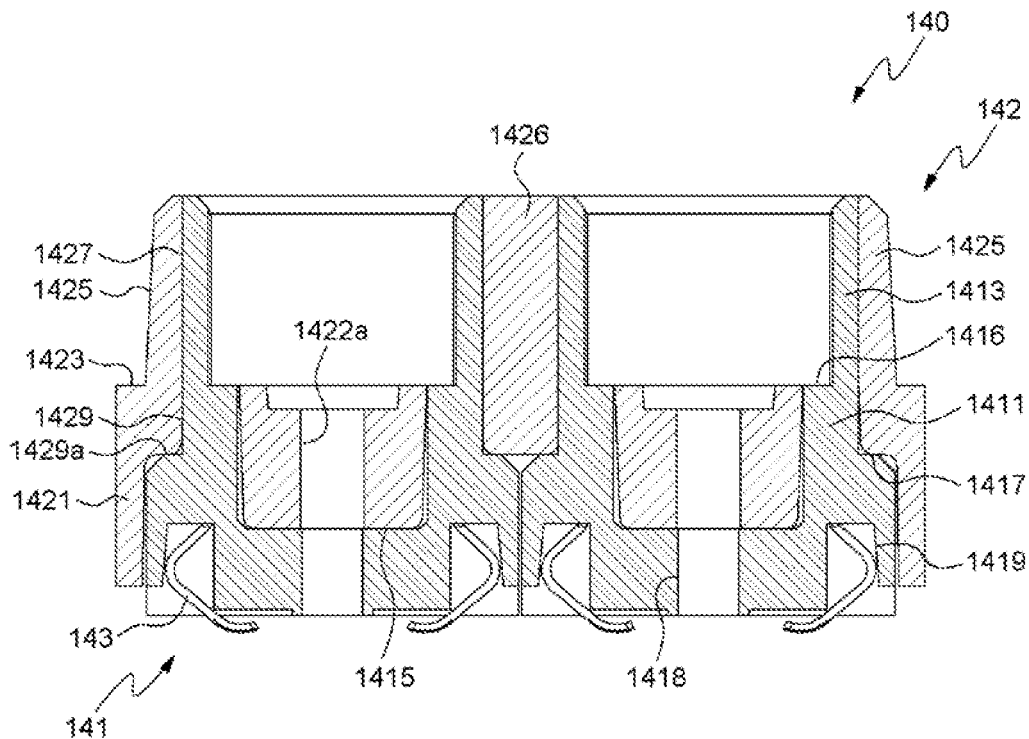
FIG. 39 is a sectional view showing the connection component of the semiconductor component test apparatus according to the present invention.
Figure 40:
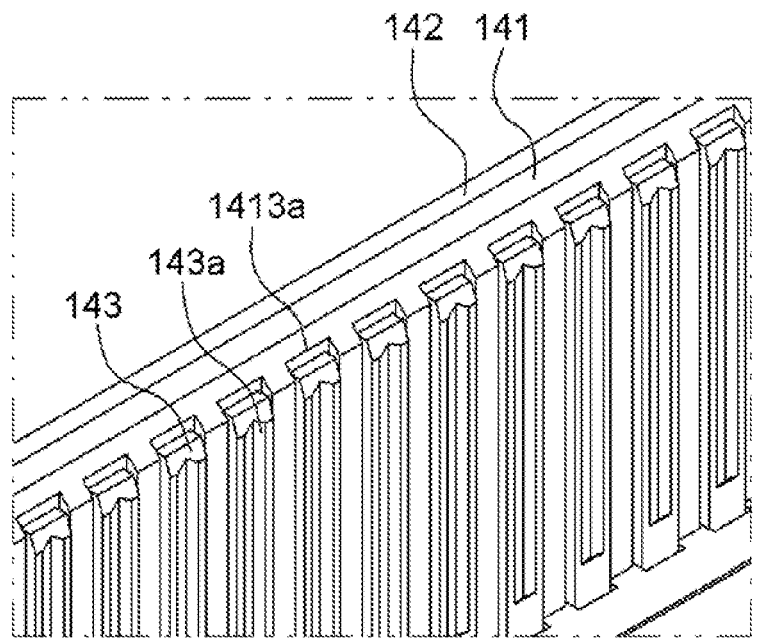
FIG. 40 is an enlarged perspective view showing a portion A of FIG. 38.

FIG. 36 is an exploded perspective view showing connection between a connection component and a substrate in a semiconductor component test apparatus according to the present invention, FIG. 37 is a perspective view showing a portion of a coupled state between fixing pins and coupling members of the connection component, FIG. 38 is a sectional view showing a portion of a coupled state between the connection component and the substrate, FIG. 39 is a sectional view showing the connection component of the semiconductor component test apparatus according to the present invention, and FIG. 40 is an enlarged perspective view showing a portion A of FIG. 38.

Figure 30:
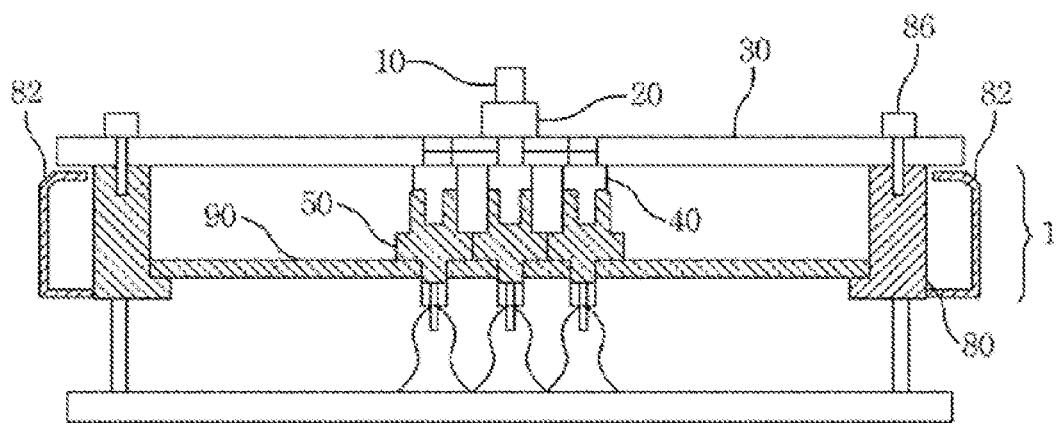
FIG. 30 is a sectional view showing a conventional semiconductor component test apparatus for texting electrical properties of semiconductor components.
Figure 31:
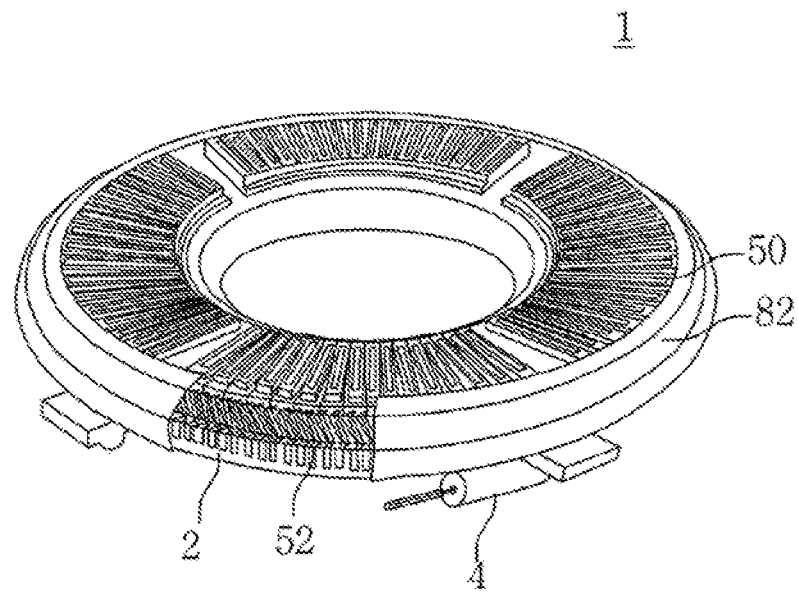
FIG. 31 is a perspective view showing connectors of the semiconductor component test apparatus of FIG. 30.
Figure 32:
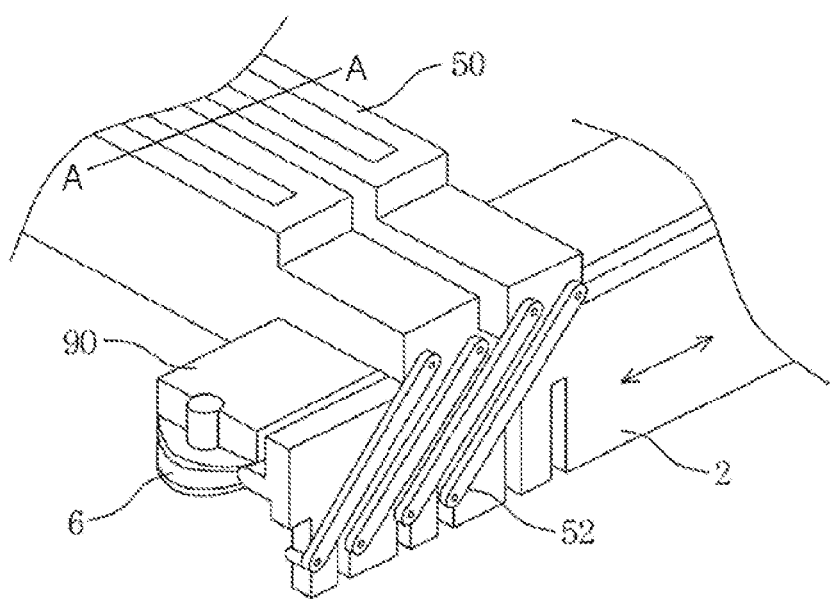
FIG. 32 is an enlarged view showing a portion of the connectors of FIG. 31.
Figure 33:
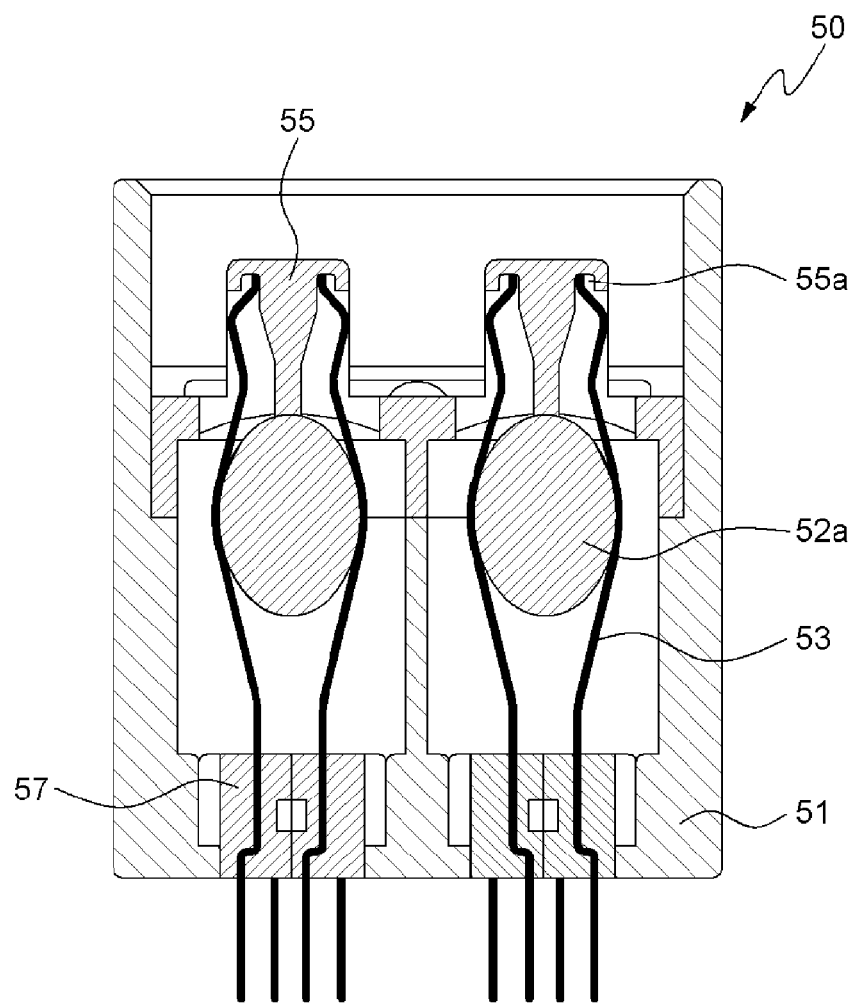
FIG. 33 is a sectional view taken along the line A-A of FIG. 32 so as to explain the connector 50.
Figure 34:
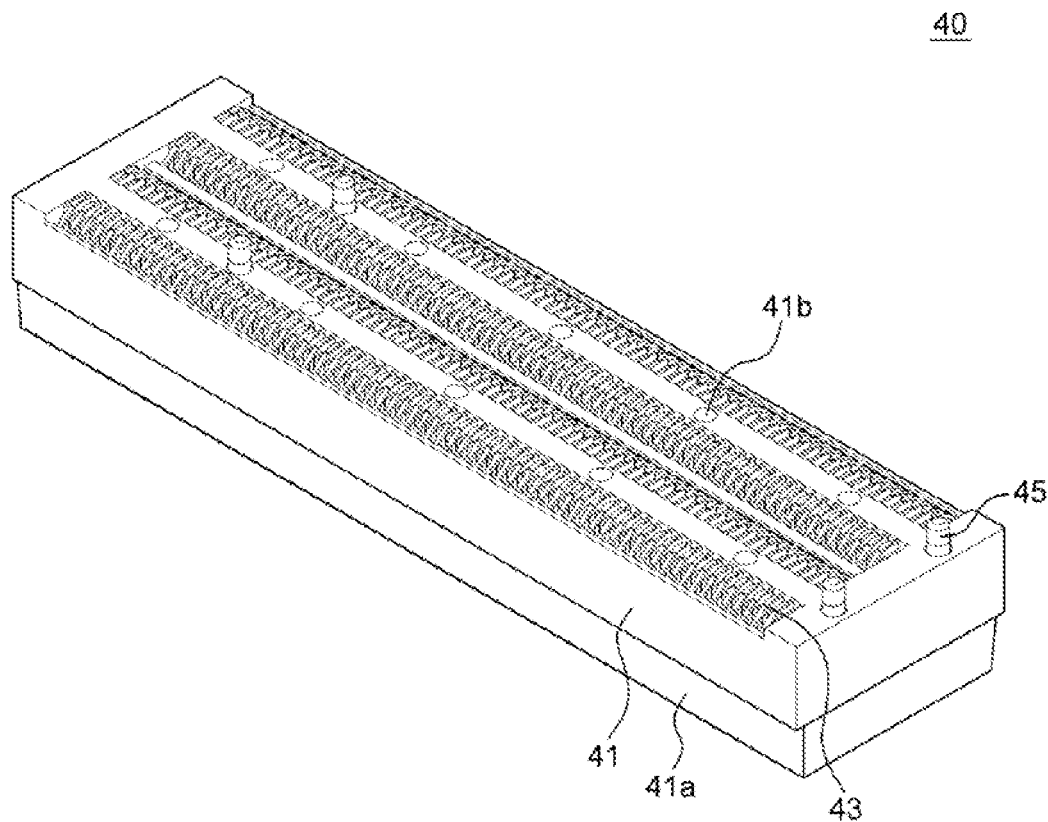
FIG. 34 is a plan perspective view showing a connection component of the conventional semiconductor component test apparatus.
Figure 35:
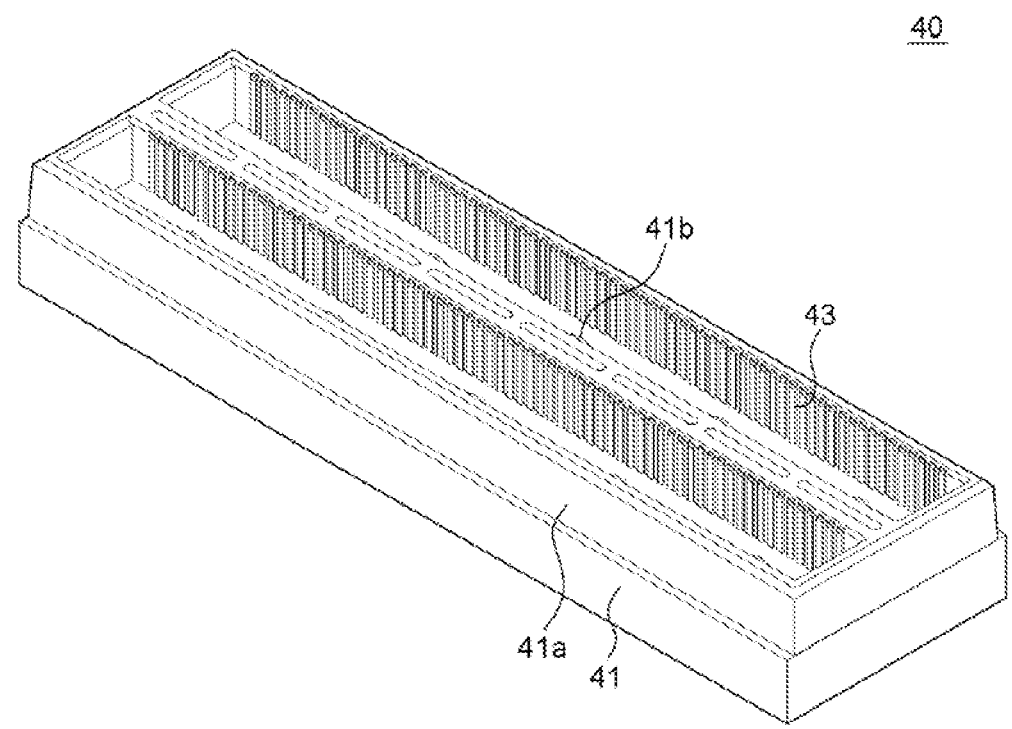
FIG. 35 is a bottom perspective view showing the connection component of FIG. 34.

Referring back to FIG. 30, a semiconductor component test apparatus according to the present invention includes a contactor 20 coming into contact with a semiconductor component 10, a substrate 30 for supplying electrical signals to the contactor 20, a plurality of connection components 140 fixed to the substrate 30, a plurality of connectors 50 detachably connected to the plurality of connection components 140, a connector stand 90 for fixing the plurality of connectors 50, and a holder 80 for supporting the plurality of connectors 50 and the connector stand 90. An explanation on the repeated parts with the conventional practice will be avoided, and accordingly, the parts according to an embodiment of the present invention will be in detail described below.

A horizontal direction in FIG. 38 is called "transverse direction", a vertical direction is called "up and down direction", and a vertical direction with respect to the surface of ground is called "longitudinal direction".

As shown in FIG. 36, each connection component 140 of the semiconductor component test apparatus according to the present invention is coupled to the substrate 30 through fixing pins 147 and coupling members 146.

The connection component 140 includes connection component bodies 141, contact pins 143, a connection component support 142, the fixing pins 147, and the coupling members 146.

As shown in FIGS. 38 and 39, the connection component bodies 141 include body bottoms 1415, first body extension portions 1411, second body extension portions 1413, and body locking projections 1412.

Each body bottom 1415 has a plate-shaped bar extended in the longitudinal direction. A plurality of body fixing pin holes 1418 are formed on the body bottom 1415. The body fixing pin holes 1418 are spaced apart from each other along the longitudinal direction of the body bottom 1415.

The first body extension portions 1411 are formed on both transverse sides of the body bottom 1415. The first body extension portions 1411 are extended upward from the body bottom 1415 in such a manner as to face each other. Concave portions between the first body extension portions 1411 and the body bottom 1415 are formed open to upward and longitudinal directions, and first body projection portions 1417 protrude upward from the transverse outsides of the first body extension portions 1411.

The second body extension portions 1413 are extended upward from the first body extension portions 1411, while having second body projection portions 1416 formed at the insides facing the first body extension portions 1411. The second body projection portions 1416 are formed at the positions separated upward from the first body projection portions 1417.

The body locking projections 1412 are formed on both longitudinal sides of each body bottom 1415. The body locking projections 1412 protrude over the first body extension portions 1411.

The connection component bodies 141 have first body grooves portions 1419 and body pin holes 1414.

The first body groove portions 1419 are open downward on both transverse sides of each body bottom 1415.

The body pin holes 1414 are penetrated in the up and down direction into each first body extension portion 1411. The body pin holes 1414 are spaced apart from each other along the longitudinal direction of the first body extension portion 1411. Top ends of the body pin holes 1414 are open to the second body projection portions 1416, and the bottom ends thereof communicate with the first body groove portions 1419.

Concave contact pin grooves 1413a are formed on the surfaces of the body pin holes 1414 facing the second body extension portions 1413. The contact pin grooves 1413a are spaced apart from each other along the longitudinal direction of the second body extension portion 1413. The contact pin grooves 1413a are extended to tops of the second body extension portions 1413, while allowing bottom ends thereof to be connected to the body pin holes 1414.

The contact pins 143 are penetrated into the body pin holes 1414 so that tops thereof are inserted into the contact pin grooves 1413a.

The contact pins 143 are spaced apart from each other along the longitudinal direction of the connection component bodies 141, while being arranged in a plurality of rows. The contact pins 143 are penetrated into the body pin holes 1414. The bottom portions of the contact pins 143 are extended to the first body groove portions 1419 in such a manner as to be exposed under the connection component bodies 141, and the top portions thereof are extended to the contact pin grooves 1413a of the second body extension portions 1413 in such a manner as to be inserted into the contact pin grooves 1413a.

As shown in FIG. 40, a concave pin portion 143a is concavely formed at the inner surface of each contact pin 143 in such a manner as to be extended along the longitudinal direction of the contact pin 143. The concave pin portion 143a has a sectional shape of "v". Through the concave pin portion 143a, two-point contacts can be made at the time when the connector pins 53 come into contact with the contact pins 143, thereby achieving stable contacts.

The connection component 140 is configured to have the two connection component bodies 141 disposed in one connection component support 142. The connection component support 142 is adapted to surround the outsides of the connection component bodies 141 parallel with each other.

The connection component support 142 is made of a metal material. As the connection component support 142 made of the metal supports the outsides of the connection component bodies 141, no damage or deformation on the connection component 140 may occur even under external impacts.

The connection component support 142 includes support bottoms 1422, a supporting portion, and a support wall 1426.

The support bottoms 1422 have shapes of bars extended in the longitudinal direction of the connection component 140. The support bottoms 1422 are spaced apart from each other on both sides of the support wall 1426.

Each support bottom 1422 has a plurality of support fixing pin holes 1422a spaced apart from each other in the longitudinal direction. The support fixing pin holes 1422a are formed at positions corresponding to the body fixing pin holes 1418.

The supporting portion is extended upward and downward from the edges of the support bottoms 1422. The supporting portion includes first supporting portions 1421 and second supporting portions 1425.

The first supporting portions 1421 are disposed along the edges of the support bottoms 1422. The first supporting portions 1421 are extended downward from the support bottoms 1422. The first supporting portions 1421 have first support projection portions 1429a formed at the insides facing in the transverse direction. The first support projection portions 1429a are located between tops and bottoms of the support bottoms 1422. Through the formation of the first support projection portions 1429a, the first supporting portions 1421 located on both transverse sides of the support bottoms 1422 are spaced apart from the support bottoms 1422 in the transverse direction.

Concave locking groove portions 1424 are formed on the lower ends of both longitudinal sides of the first supporting portions 1421.

The second supporting portions 1425 are extended upward from the first supporting portions 1421, while having second support projection portions 1423 formed upward from the transverse outsides of the support bottoms 1422.

The support wall 1426 is extended upward from the transverse center of the support bottoms 1422 in such a manner as to allow both longitudinal ends thereof to be connected to the supporting portion. The lower end of the support wall 1426 is located more upward than the lower ends of the support bottoms 1422. The support wall 1426 and the supporting portion have upwardly open concave support portions 1427 located on both transverse sides of the support wall 1426.

The connection component support 142 has extension portion insertion holes 1429.

The extension portion insertion holes 1429 are penetrated in the up and down direction into the support bottoms 1422 in such a manner as to be extended in the longitudinal direction. The extension portion insertion holes 1429 are formed on both sides of the support bottoms 1426 and the transverse insides of the supporting portion. The extension portion insertion holes 1429 formed on both sides of the support bottoms 1426 communicate with each other under the support wall 1426.

If the connection component support 142 is coupled to the connection component bodies 141, the connection component bodies 141 are moved upward toward both sides of the support wall 1426 to allow the first body extension portions 1411 and the second body extension portions 1413 to be inserted into the extension portion insertion holes 1429. The outer surfaces of the first body extension portions 1411 and the second body extension portions 1413 supportedly come into contact with the inner surfaces of the supporting portion and the support wall 1426. The first body projection portions 1417 formed on the transverse outsides of the connection component bodies 141 lockedly come into contact with the first support projection portions 1429a, and the first body projection portions 1417 formed on the transverse insides of the connection component bodies 141 lockedly come into contact with the lower end of the support wall 1426. Further, the body locking projections 1412 of the connection component bodies 141 are inserted into the locking groove portions 1424.

The support bottoms 1422 are inserted between the concave portions formed by the first body extension portions 1411 and the body bottoms 1415, and the support fixing pin holes 1422a and the body fixing pin holes 1418 communicate with each other to form fixing pin holes through which the fixing pins 147 are passed.

The connection component 140 and the coupling members 146 are located on both sides of the substrate 30, while placing the substrate 30 therebetween, and they are coupled to each other by means of the fixing pins 147.

The fixing pins 147 are passed through the fixing pin holes. The fixing pins 147 have heads locked onto the support fixing pin holes 1422a and are sequentially passed through the support fixing pin holes 1422a, the body fixing pin holes 1418 and substrate fixing pin holes 30a formed on the substrate 30. The end portions of the fixing pins 147 are locked onto pin locking portions of the coupling members 146 disposed on the underside of the substrate 30.

As shown in FIG. 37, the coupling members 146 are disposed on the underside of the substrate 30. Each coupling member 146 has a shape of a plate-shaped bar extended in the longitudinal direction of the connection component 140. A reference numeral 33 in FIG. 38 denotes an insulation film disposed between the coupling member 146 and the substrate 30.

The coupling member 146 has a plurality of pin locking portions spaced apart from each other along the longitudinal direction. Each pin locking portion has two pin locking members 1461 incised to a shape of "E" so that the two pin locking members 1461 have one side end connected to the coupling member 146 and free end portions facing each other.

Each fixing pin 147 is inserted between the pin locking members 1461 in such a manner as to allow both side peripheries thereof to come into contact with the pin locking members 1461. A reference numeral 1463 denotes a coupling member installing hole through which the coupling member 146 is fixedly coupled to the substrate 30 by means of a bolt.

Locking contact portions 1461a as the free ends of the pin locking members 1461 have shapes of concave arch. As a result, contact areas between the locking contact portions 1461a and the fixing pin 147 are increased at the time when the fixing pin 147 is inserted into the pin locking members 1461, thereby allowing the fixing pin 147 to be rigidly coupled to the pin locking members 1461.

If the fixing pins 147 are inserted into the pin locking portions, the pin locking members 1461 are pushed downward by means of the fixing pins 147 in such a manner as to be slantly deformed downward to cause a distance between the free ends to become long, thereby locating the fixing pins 147 between the free ends.

The pin locking members 1461 are slantly bent downward from the coupling member 146 to allow the facing free ends thereof to be spaced apart from each other.

If the fixing pins 147 are inserted between the free ends of the pin locking portions, the pin locking members 1461 are deformedly pushed downward so that the slant angles of the pin locking members 1461 are increased and the distance between the free ends are also long, thereby locating the fixing pins 147 between the free ends.

The pin locking members 1461 are slant to allow the free ends to be moved downward at the time when the fixing pins 147 are inserted between the free ends, and accordingly, the fixing pins 147, which coupledly come into contact with the free ends on both sides thereof, are supported rigidly against the pin locking members 1461. If the fixing pins 147 are pulled upward, a distance between the free ends becomes short, and accordingly, pressurizing forces applied from both sides of the fixing pins 147 are increased. Once the fixing pins 147 are coupled to the pin coupling portions, as a result, they are in rigidly coupled state with the pin locking portions, thereby making it hard to separate them from the pin locking portions.

The present invention may be modified in various ways and may have several exemplary embodiments. Specific exemplary embodiments of the present invention are illustrated in the drawings and described in detail in the detailed description. However, this does not limit the invention within specific embodiments and it should be understood that the invention covers all the modifications, equivalents, and replacements within the idea and technical scope of the invention.

INDUSTRIAL APPLICABILITY

According to the present invention, the low insertion force connector assembly has the first connector and the second connector detachably coupled to each other, so that the first connector and the second connector can be coupled to each other easily and rigidly, thereby preventing occurrence of poor contact, improving dimensional stability, and achieving easiness in manufacturing the connectors.

According to the present invention, further, the semiconductor component test apparatus can couple the connection components to the substrate simply and rigidly, achieve stable contacts between the connector pins and the contact pins, and protect the connection components from external impacts to prevent damage or breakage of the connection components.

The invention claimed is:

1. A low insertion force connector assembly comprising a first connector 100 and a second connector 200 detachably coupled to each other,
    wherein the first connector 100 comprises an insertion groove 101 having a shape of a rectangular section and formed concavely toward the second connector 200 in such a manner as to insert a connector insertion portion 211 of the second connector 200 thereinto, first connector fastening holes 123g penetrated onto both longitudinal sides of the insertion groove 101 in an up and down direction in such a manner as to be coupled to a test head A by means of bolts B inserted thereinto, protruding portions formed in the insertion groove 101 in such a manner as to be inserted into the second connector 200, a plurality of pin modules 140 spaced apart from each other and having a plurality of pins 142, and driving shafts 160 rotatably disposed on the plurality of pins 142 spaced apart from each other to pressurize the plurality of pins 142 outward, the protruding portions having side surfaces spaced apart from the inner surfaces of the insertion groove 101, and the plurality of pins 142 of the pin modules 140 being arranged to be exposed to both transverse sides of the protruding portions; and
    the second connector 200 comprises a connector insertion portion 211 having a shape of a rectangular section in such a manner as to be inserted into the insertion groove 101, connector concave portions 210a formed on the connector insertion portion 211 in such a manner as to be open toward the first connector 100 to insert the protruding portions 133, and a plurality of pins 220 arranged on both transverse sides of the connector concave portions 210a, so that if the protruding portions are inserted into the connector concave portions 210a, the plurality of pins 142 of the first connector 100 are arranged to face the plurality of pins 220 of the second connector 200,
    wherein the first connector comprises two outer members 110 facing each other, an intermediate member 120 located between the two outer members 110, four pin modules 140 disposed between the intermediate member 120 and the outer members 110 on both transverse sides of the intermediate member 120, a top member 130 inserted into the outer members 110 on both transverse sides thereof in such a manner as to be disposed on top of the intermediate member 120, two driving shafts 160 rotatably disposed between the intermediate member 120 and the outer members 110 under the top member 130 and having end portions protruding from one longitudinal side, and handles 170 disposed on the protruding end portions of the two driving shafts 160, each of the two outer members 110 comprising: a plate-shaped outer member body 111; outer member side portions 113 formed on both ends of the plate-shaped outer member body 111 in such a manner as to protrude inward; outer member protrusion portions 115 protruding inward from tops of the outer member side portions 113, the two outer members 110 facing each other being coupled to each other in such a manner as to allow the ends of the outer member protrusion portions 115 to come into contact with each other; body inner surfaces 111a inclinedly extended toward tops thereof; top member insertion grooves 111b concavely extended downward from the body inner surfaces 111a; outer member pin insertion grooves 111c extended downward from the top member insertion grooves 111b in such a manner as to be concavely spaced apart from the top member insertion grooves 111b; outer member protrusions 113e protruding inward from the outer member side portions 113; outer member coupling holes 115b spaced apart from each other in the up and down direction around the outer member protrusions 113e in such a manner as to be penetrated, the outer member coupling holes 115b being formed on the outer member protrusion portion 115 and the outer member side portion 113, respectively; outer member axial grooves 113a extended on the outer member side portions 113 between the outer member protrusion portions 115 and the outer member protrusions 113e in the up and down direction; and outer member lower protrusions 113b extended more downward than the plate-shaped outer member body 111 from the outer member side portions 113 in such a manner as to form downward protruding surface and having PCB fastening holes 113f penetrated thereinto.

2. The low insertion force connector assembly according to claim 1, wherein the insertion groove 101 comprises the body inner surfaces 111a facing each other and side inner surfaces 115a facing each other, so that a transverse distance between the body inner surfaces 111a and a longitudinal distance between the side inner surfaces 115a are increased toward the open end portion of the insertion groove 101, and the connector insertion portion 211 comprises first insertion surfaces 211a and second insertion surfaces 211b, a distance between the first insertion surfaces 211a and a distance between the second insertion surfaces 211b are reduced as the first insertion surfaces 211a and the second insertion surfaces 211b go toward the ends of the connector insertion portion 211.

3. The low insertion force connector assembly according to claim 2, wherein the bolts B are inserted into the first connector fastening holes 123g in such a manner as to be fastened to fastening portions A1 of the test head A to allow the first connector 100 to be built on the test head A, each bolt B comprising a bolt head portion B1, a bolt guide portion B2 having a protruding surface from the bolt head portion B in such a manner as to be extended, and a bolt fastening portion B3 having a bolt protruding portion B4 from the bolt guide portion B2 in such a manner as to be extended and screw-fastened to the fastening portion A1 of the test head A, and if the bolt fastening portion B3 of the bolt B is screw-fastened to the test head A, the bolt protruding portion B4 pressurizes the test head A so that the first connector 100 is slidable laterally between the bolt head portion B1 and the test head A, the bolt guide portion B2 is located at the first connector fastening hole 123g, and a tolerance is formed laterally between the bolt guide portion B2 and the first connector fastening hole 123g.

4. The low insertion force connector assembly according to claim 1, wherein the intermediate member 120 comprises: a plate-shaped intermediate member body 121; and intermediate member side portions 123 formed on both longitudinal ends of the intermediate member body 121, the intermediate member side portions 123 having intermediate member side protrusions 123h protruding from tops thereof, tops of the intermediate member side portions 123 protruding more upward than top of the intermediate member body 121, the intermediate member body 121 having first intermediate member surfaces 121c formed slantly on both transverse sides thereof in such a manner as to become increased in thickness from the top to the bottom and intermediate member pin insertion grooves 121a concavely formed spaced apart from the first intermediate member surfaces 121c in the down direction at positions facing the outer member pin insertion grooves 111c the intermediate member side portions 123 having PCB seating portions 123e formed by reducing thicknesses of the insides thereof in such a manner as to form inward and downward protruding surfaces, the PCB seating portions 123e having PCB fastening holes 123f penetrated thereinto, intermediate member axial grooves 123a concavely formed on both transverse sides thereof in such a manner as to face the outer member axial grooves 113a, outer member protrusion grooves 123b concavely formed on both transverse sides thereof in such a manner as to insert the outer member protrusions 113e, and intermediate member coupling holes 123c spaced apart from the outer member protrusion grooves 123b in the down direction in such a manner as to be penetrated thereinto at the positions where the outer member coupling holes 115b of the outer member side portions 113 are formed, the first connector fastening holes 123g being penetrated in the up and down direction into the intermediate member side protrusions 123h.

5. The low insertion force connector assembly according to claim 4, wherein the outer member side portions 113 have concave side support surfaces 113g facingly formed concavely at the position where the outer member pin insertion groove 111c is formed, the concave side support surfaces 113g whose end portions being connected to the outer member pin insertion groove 111c.

6. The low insertion force connector assembly according to claim 5, wherein the intermediate member side portions 123 have concave intermediate member support surfaces 123d facingly formed concavely at the positions where the intermediate member pin insertion grooves 121a are formed in such a manner as to connect end portions thereof to the intermediate member pin insertion grooves 121a.

7. The low insertion force connector assembly according to claim 6, wherein the top member 130 comprises: a top member body 131 having top member concave portions 131a concave downward from the underside thereof; and top member protruding portions 133 protruding upward from the top member body 131 in such a manner as to be spaced apart from each other, the top member body 131 having top member body protrusions 131b protruding from both transverse sides thereof in such a manner as to be inserted into the top member insertion grooves 111b and top member pin holes 135 extended from the top member concave portions 131a to the top member protruding portions 133, the top member pin holes 135 being formed in four rows so that the two rows thereof are formed on one top member concave portion 131a and one top member concave portion 131a and the two rows thereof being formed on the other top member concave portion 131a and the other top member concave portion 131a.

8. The low insertion force connector assembly according to claim 7, wherein each pin module 140 comprises: a bar-shaped pin module body 141; a plate-shaped pin module support 143 extended upward from the pin module body 141; a plurality of pins 142 penetrated into the pin module body 141 and the pin module support 143 in the up and down direction in such a manner as to allow top ends thereof to protrude upward from the pin module support 143 and to allow bottom ends thereof to protrude downward from the pin module body 141; a pin module coupling groove 147 and a pin module coupling protrusion 145 formed on one side of the pin module body 141 coming into contact with the pin module 140 adjacent thereto in such a manner as to be spaced apart from each other in the longitudinal direction, the pin module coupling protrusion 145 of the adjacent pin module 140 being inserted into the pin module coupling groove 147, and the pin module coupling groove 147 of the adjacent pin module 140 inserting the pin module coupling protrusion 145 thereinto; and a plurality of concave pin module body grooves 141a spaced apart from each other on the opposite transverse surface to the pin module body 141 in such a manner as to be concavely penetrated in the up and down direction, and a plurality of intermediate member pin protrusions 121b are spaced apart from each other in the intermediate member pin insertion groove 121a in such a manner as to protrude therefrom toward the outer members 110, so that when the pin modules 140 are coupled to the outer members 110, the pin module bodies 141 of the pin modules 140 are inserted into the outer member pin insertion grooves 111c and the pin insertion protrusions 111e are inserted into the pin module body grooves 141a, and when the pin modules 140 are coupled to the intermediate member 120, the pin module bodies 141 of the pin modules 140 are inserted into the intermediate member pin insertion grooves 121a and the intermediate member pin protrusions 121b are inserted into the pin module body grooves 141a.

9. A low insertion force connector assembly comprising a first connector 100 and a second connector 200 detachably coupled to each other,
wherein the first connector 100 comprises an insertion groove 101 having a shape of a rectangular section and formed concavely toward the second connector 200 in such a manner as to insert a connector insertion portion 211 of the second connector 200 thereinto, first connector fastening holes 123g penetrated onto both longitudinal sides of the insertion groove 101 in an up and down direction in such a manner as to be coupled to a test head A by means of bolts B inserted thereinto, protruding portions formed in the insertion groove 101 in such a manner as to be inserted into the second connector 200, a plurality of pin modules 140 spaced apart from each other and having a plurality of pins 142 direction in such a manner as to allow the plurality of pins 142 of the pin module 140 and the plurality of pins 142 of the adjacent pin module 140 to be spaced apart from each other, and driving shafts 160 rotatably disposed on the plurality of pins 142 spaced apart from each other to pressurize the plurality of pins 142 outward, the protruding portions having side surfaces spaced apart from the inner surfaces of the insertion groove 101, and the plurality of pins 142 of the pin modules 140 being arranged to be exposed to both transverse sides of the protruding portions; and the second connector 200 comprises a connector insertion portion 211 having a shape of a rectangular section in such a manner as to be inserted into the insertion groove 101, connector concave portions 210a formed on the connector insertion portion 211 in such a manner as to be open toward the first connector 100 to insert the protruding portions 133, and a plurality of pins 220 arranged on both transverse sides of the connector concave portions 210a, so that if the protruding portions are inserted into the connector concave portions 210a, the plurality of pins 142 of the first connector 100 are arranged to face the plurality of pins 220 of the second connector 200, the first connector 100 comprising two outer members 110 facing each other, an intermediate member 120 located between the two outer members 110, the four pin modules 140 disposed between the intermediate member 120 and the outer members 110 on both transverse sides of the intermediate member 120, a top member 130 inserted into the outer members 110 on both transverse sides thereof in such a manner as to be disposed on top of the intermediate member 120, the two driving shafts 160 rotatably disposed between the intermediate member 120 and the outer members 110 under the top member 130 and having end portions protruding from one longitudinal side, and handles 170 disposed on the protruding end portions of the driving shafts 160, wherein each outer member 110 comprises: a plate-shaped outer member body 111; outer member side portions 113 formed on both ends of the plate-shaped outer member body 111 in such a manner as to protrude inward; outer member protrusion portions 115 protruding inward from tops of the outer member side portions 113, the outer members 110 facing each other being coupled to each other in such a manner as to allow the ends of the outer member protrusion portions 115 to come into contact with each other; body inner surfaces 111a inclinedly extended toward tops thereof; top member insertion grooves 111b concavely extended downward from the body inner surfaces 111a; outer member pin insertion grooves 111c extended downward from the top member insertion grooves 111b in such a manner as to be concavely spaced apart from the top member insertion grooves 111b; outer member axial grooves 113a extended on the outer member side portions 113 between the outer member protrusion portions 115 and the outer member protrusions 113e in the up and down direction; and outer member lower protrusions 113b extended more downward than the plate-shaped outer member body 111 from the outer member side portions 113 in such a manner as to form downward protruding surface and having PCB fastening holes 113f penetrated thereinto, and wherein the intermediate member 120 comprises: a plate-shaped intermediate member body 121; and intermediate member side portions 123 formed on both longitudinal ends of the intermediate member body 121, the intermediate member side portions 123 having intermediate member side protrusions 123h protruding from tops thereof, tops of the intermediate member side portions 123 protruding more upward than top of the intermediate member body 121, the intermediate member body 121 having first intermediate member surfaces 121c formed slantly on both transverse sides thereof in such a manner as to become increased in thickness from the top to the bottom and intermediate member pin insertion grooves 121a concavely formed spaced apart from the first intermediate member surfaces 121c in the down direction at positions facing the outer member pin insertion grooves 111c, and the intermediate member side portions 123 having PCB seating portions 123e formed by reducing thicknesses of the insides thereof in such a manner as to form inward and downward protruding surfaces, the PCB seating portions 123e having PCB fastening holes 123f penetrated thereinto, and intermediate member axial grooves 123a concavely formed on both transverse sides thereof in such a manner as to face the outer member axial grooves 113a, the first connector fastening holes 123g being penetrated in the up and down direction into the intermediate member side protrusions 123h.

10. The low insertion force connector assembly according to claim 9, wherein each pin module 140 comprises: a bar-shaped pin module body 141; a plate-shaped pin module support 143 extended upward from the pin module body 141; the plurality of pins 142 penetrated into the pin module body 141 and the pin module support 143 in the up and down direction in such a manner as to allow top ends thereof to protrude upward from the pin module support 143 and to allow bottom ends thereof to protrude downward from the pin module body 141; and a pin module coupling groove 147 and a pin module coupling protrusion 145 formed on one side of the pin module body 141 coming into contact with the pin module 140 adjacent thereto in such a manner as to be spaced apart from each other, so that as the pin module coupling protrusion 145 of the pin module body 141 of one side pin module 140 is inserted into the pin module coupling groove 147 of the other side pin module 140 and the pin module coupling groove 147 of the pin module body 141 of one side adjacent pin module 140 inserts the pin module coupling protrusion 145 of the other side pin module 140, the two pin modules 140 are laminated between the intermediate member 120 and the outer member 110 thereinto.

11. The low insertion force connector assembly according to claim 9, wherein each pin module 140 has a plurality of concave pin module body grooves 141a spaced apart from each other on the opposite transverse surface to the surface where the pin module coupling groove 147 and the pin module coupling protrusion 145 of the pin module body 141 are formed in such a manner as to be extended in the up and down direction; a plurality of pin insertion protrusions 111e protrude inward from the outer member pin insertion grooves 111e in such a manner as to be spaced apart from each other; and a plurality of intermediate member pin protrusions 121b are spaced apart from each other in the intermediate member pin insertion groove 121a in such a manner as to protrude therefrom toward the outer members 110, so that when the pin modules 140 are coupled to the outer members 110, the pin module bodies 141 of the pin modules 140 are inserted into the outer member pin insertion grooves 111c and the pin insertion protrusions 111e are inserted into the pin module body grooves 141a, and when the pin modules 140 are coupled to the intermediate member 120, the pin module bodies 141 of the pin modules 140 are inserted into the intermediate member pin insertion grooves 121a and the intermediate member pin protrusions 121b are inserted into the pin module body grooves 141a.

12. The low insertion force connector assembly according to claim 11, wherein the outer member side portions 113 have concave side support surfaces 113g facingly formed concavely at the position where the outer member pin insertion groove 111c is formed, the concave side support surfaces 113g whose end portions being connected to the outer member pin insertion groove 111c; and the intermediate member side portions 123 have concave intermediate member support surfaces 123*d* facingly formed concavely at the positions where the intermediate member pin insertion grooves 121*a* are formed in such a manner as to connect end portions thereof to the intermediate member pin insertion grooves 121*a*, so that both longitudinal ends of the pin module body 141 of one side pin module 140 of the two pin modules 140 disposed between the intermediate member 120 and the outer member 110 come into contact with the concave side support surfaces 113*g*, and both longitudinal ends of the pin module body 141 of the other side pin module 140 come into contact with the concave intermediate member support surfaces 123*d*.

13. The low insertion force connector assembly according to claim 11, wherein the second connector 200 comprises a connector body 210 having a shape of a rectangular section and the connector insertion portion 211 extended downward from a connector projection surface 213 protruding downward from the underside of the connector body 210, the connector body 210 having two connector concave portions 210*a* spaced apart from each other and connector body pin holes 217 formed thereon in such a manner as to be extended upward and open on the top thereof and to allow bottoms thereof to communicate with the connector concave portions 210*a*, the connector body pin holes 217 being formed on both transverse sides of each connector concave portion 210*a* in such a manner as to be spaced apart from each other and communicate with the connector concave portions 210*a*, and the plurality of pins 220 are inserted into the connector body pin holes 217 in such a manner as to allow top ends thereof to protrude upward from the top of the connector body 210 and to allow bottom ends thereof to be exposed to the connector concave portions 210*a* through the connector body pin holes 217, the plurality of pins 220 being arranged on each connector concave portion 210*a* in two rows.

14. The low insertion force connector assembly according to claim 13, wherein each connector body pin hole 217 has an expanded pin hole portion 219 expanded from the top thereof, while placing the respective connector concave portions 210*a* therebetween, and each pin 220 comprises a first bar-shaped pin portion 221 extended in the up and down direction, a second pin portion 223 bent from top of the first pin portion 221 in such a manner as to allow an end portion thereof to be slantly extended toward the expanded direction of the expanded pin hole portion 219, a third pin portion 225 bent from top of the second pin portion 223 in such a manner as to allow an end portion thereof to be slantly extended toward the opposite direction to the second pin portion 223, and a fourth pin portion 227 bent from top of the third pin portion 225 in such a manner as to allow an end portion thereof to be slant toward the connector body 210, a bent portion between the third pin portion 225 and the fourth pin portion 227 being located more inward than the inner surfaces of the connector concave portions 210*a*.

15. The low insertion force connector assembly according to claim 13, wherein each pin 220 comprises a first bar-shaped pin portion 221 extended in the up and down direction, a third pin portion 225 bent and extended slantly from top of the first pin portion 221, and a fourth pin portion 227 bent from top of the third pin portion 225 in such a manner as to allow an end portion thereof to be slant toward the connector body 210, a bent portion between the third pin portion 225 and the fourth pin portion 227 being located more inward than the inner surfaces of the connector concave portions 210*a*.

\* \* \* \* \*